US012185583B2

(12) United States Patent
Kim et al.

(10) Patent No.: US 12,185,583 B2
(45) Date of Patent: Dec. 31, 2024

(54) DISPLAY APPARATUS HAVING PIXEL CIRCUIT THAT COMMONLY DRIVES LIGHT-EMITTING ELEMENTS ON DIFFERENT ROWS

(71) Applicant: Samsung Display Co., Ltd., Yongin-si (KR)

(72) Inventors: Sunho Kim, Yongin-si (KR); Gunhee Kim, Yongin-si (KR); Juchan Park, Yongin-si (KR); Taehoon Yang, Yongin-si (KR); Sunhee Lee, Yongin-si (KR); Jaeun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 366 days.

(21) Appl. No.: 17/592,527

(22) Filed: Feb. 4, 2022

(65) Prior Publication Data

US 2022/0254853 A1    Aug. 11, 2022

(30) Foreign Application Priority Data

Feb. 5, 2021    (KR) .................... 10-2021-0016837

(51) Int. Cl.
*H01L 29/08* (2006.01)
*H10K 59/121* (2023.01)
*H10K 59/131* (2023.01)
*H10K 59/35* (2023.01)

(52) U.S. Cl.
CPC ..... *H10K 59/1213* (2023.02); *H10K 59/1216* (2023.02); *H10K 59/131* (2023.02); *H10K 59/352* (2023.02); *H10K 59/353* (2023.02)

(58) Field of Classification Search
CPC ............. H10K 59/1213; H10K 59/353; H10K 59/131; H10K 59/352; H10K 59/1216
USPC ........................................................... 257/40
See application file for complete search history.

(56) References Cited

U.S. PATENT DOCUMENTS

| 9,959,808 | B2 | 5/2018 | Sun |
| 10,204,541 | B2 | 2/2019 | Kawashima et al. |
| 10,558,046 | B2 | 2/2020 | Jang |
| 2016/0093679 | A1* | 3/2016 | Moon .................. H10K 10/462 257/40 |
| 2016/0125781 | A1 | 5/2016 | Yang |

FOREIGN PATENT DOCUMENTS

| CN | 113764460 A | * 12/2021 | ......... H01L 27/3218 |
| CN | 113838888 A | * 12/2021 | ........... H01L 27/124 |
| CN | 109410823 B | * 4/2022 | ............... G09G 3/20 |
| JP | 2017103488 A | * 6/2017 | |
| KR | 10-2016-0054141 | 5/2016 | |
| KR | 10-2017-0135403 | 12/2017 | |
| KR | 10-1878087 | 7/2018 | |
| KR | 10-1970088 | 4/2019 | |
| WO | WO-2021035531 A | * 3/2021 | |

* cited by examiner

*Primary Examiner* — Phuc T Dang
(74) *Attorney, Agent, or Firm* — KILE PARK REED & HOUTTEMAN PLLC

(57) ABSTRACT

A display apparatus includes a substrate a first pixel circuit arranged on the substrate, and a plurality of light-emitting elements arranged in a matrix on the substrate. The first pixel circuit is configured to commonly drive a first light-emitting element located in a first row and a second light-emitting element located in a second row different from the first row from among the plurality of light-emitting elements.

20 Claims, 18 Drawing Sheets

DISPLAY APPARATUS HAVING PIXEL CIRCUIT THAT COMMONLY DRIVES LIGHT-EMITTING ELEMENTS ON DIFFERENT ROWS

CROSS-REFERENCE TO RELATED APPLICATION

This application claims priority from and the benefit of Korean Patent Application No. 10-2021-0016837, filed on Feb. 5, 2021, which is hereby incorporated by reference for all purposes as if fully set forth herein.

BACKGROUND

Field

Embodiments of the invention relate generally to a display apparatus.

Discussion of the Background

Mobility-based electronic devices are widely used. Recently, tablet personal computers (PCs), in addition to small electronic devices such as mobile phones, have become widely used as mobile electronic devices.

A mobile electronic device includes a display apparatus to provide various functions, for example, visual information such as an image, to a user. As sizes of other components for driving a display apparatus have recently decreased, the proportion of the display apparatus in an electronic device has gradually increased, and demand for a display apparatus having a high resolution is increasing.

A display apparatus may include a display area and a peripheral area outside the display area. A scan line and a data line may be formed in the display area to be insulated from each other, and a plurality of pixel circuits connected to the scan line and the data line may also be located in the display area. Light may be emitted by a light-emitting element driven by each pixel circuit, to provide an image. Each pixel circuit may receive a scan signal through the scan line during a scan-on time (SOT), and may receive a data signal through the data line during the SOT when the scan signal is received.

The above information disclosed in this Background section is only for understanding of the background of the inventive concepts, and, therefore, it may contain information that does not constitute prior art.

SUMMARY

Devices constructed according to illustrative implementations of the invention are capable of increasing the image capabilities of a small-sized display device.

When a resolution of a display apparatus decreases, a screen-door effect (SDE) in which a gap between pixels is visible to a user's eyes may occur. In order to prevent this effect, a resolution of the display apparatus may be increased. However, when a resolution of a display apparatus increases, the number of required pixel circuits, scan lines, and data lines also increases, and thus there may be some limitations in increasing the resolution of the display apparatus.

Additional features of the inventive concepts will be set forth in the description which follows, and in part will be apparent from the description, or may be learned by practice of the inventive concepts.

One or more embodiments include a display apparatus that may prevent a screen-door effect by maintaining a high resolution and may reduce the number of pixel circuits, scan lines, and data lines required to drive a high-resolution display apparatus. However, the embodiments are examples, and do not limit the scope of the inventive concepts.

Additional aspects will be set forth in part in the description which follows and, in part, will be apparent from the description, or may be learned by practice of the presented embodiments.

According to one or more embodiments, a display apparatus includes a substrate, a first pixel circuit arranged on the substrate, and a plurality of light-emitting elements arranged in a matrix on the substrate, wherein the first pixel circuit is configured to commonly drive a first light-emitting element located in a first row and a second light-emitting element located in a second row different from the first row from among the plurality of light-emitting elements.

The first light-emitting element may be located in a first column, and the second light-emitting element may be located in a second column different from the first column, and the first light-emitting element and the second light-emitting element may emit light of a first color.

The display apparatus may further include a second pixel circuit arranged on the substrate, wherein the second pixel circuit is configured to commonly drive a third light-emitting element and a fourth light-emitting element located in a third column between the first column and the second column from among the plurality of light-emitting elements.

The third light-emitting element and the fourth light-emitting element may emit light of a second color different from the first color.

The second pixel circuit may be further configured to commonly drive a seventh light-emitting element and an eighth light-emitting element located in a fourth column spaced apart from the third column with the second column therebetween from among the plurality of light-emitting elements.

The display apparatus may further include a third pixel circuit arranged on the substrate, wherein the third pixel circuit is configured to commonly drive a fifth light-emitting element located in the first row and the second column and a sixth light-emitting element located in the second row and the first column from among the plurality of light-emitting elements, wherein the fifth light-emitting element and the sixth light-emitting element emit light of a third color different from the first color and the second color.

The display apparatus may further include a scan line extending in a row direction and commonly connected to the first through third pixel circuits.

The display apparatus may further include a plurality of data lines extending in a column direction, wherein the first through third pixel circuits are respectively connected to first through third data lines that are different from one another from among the plurality of data lines.

The display apparatus may further include a fourth pixel circuit arranged on the substrate, and a plurality of data lines extending in a column direction, wherein the fourth pixel circuit is configured to commonly drive a seventh light-emitting element and an eighth light-emitting element located in a fourth column spaced apart from the third column with the second column therebetween from among the plurality of light-emitting elements, wherein the third light-emitting element and the fourth light-emitting element emit light of a second color different from the first color, wherein the second pixel circuit and the fourth pixel circuit are connected to one of the plurality of data lines.

The display apparatus may further include a display area including a first display area and a second display area adjacent to a side of the first display area, and a peripheral area outside the display area, wherein the first pixel circuit is located only in the second display area.

The display apparatus may further include a conductive layer configured to electrically connect the first pixel circuit to the first and second light-emitting elements.

Each of the first light-emitting element and the second light-emitting element may include a pixel electrode on the substrate, an opposite electrode on the pixel electrode, and an intermediate layer located between the pixel electrode and the opposite electrode, wherein the pixel electrode of the first light-emitting element and the pixel electrode of the second light-emitting element are integrally formed with each other.

According to one or more embodiments, a display apparatus includes a substrate, a plurality of pixel circuits located on the substrate, and each including a thin-film transistor and a storage capacitor, a first organic insulating layer covering the plurality of pixel circuits, and a plurality of light-emitting elements located on the first organic insulating layer and arranged in rows and columns in a plan view, wherein a first pixel circuit from among the plurality of pixel circuits is configured to commonly drive a first light-emitting element located in a first row and a second light-emitting element located in a second row different from the first row from among the plurality of light-emitting elements.

Each of the plurality of light-emitting elements may include a pixel electrode arranged on the first organic insulating layer, an opposite electrode arranged on the pixel electrode, and an intermediate layer located between the pixel electrode and the opposite electrode.

The display apparatus may further include a conductive layer located on the first organic insulating layer and electrically connected to the first pixel circuit, and a second organic insulating layer located between the conductive layer and the pixel electrodes of the plurality of light-emitting elements, wherein the conductive layer is electrically connected to both a first pixel electrode of the first light-emitting element and a second pixel electrode of the second light-emitting element.

The display apparatus may further include an inorganic insulating layer located between the first organic insulating layer and the conductive layer.

A first pixel electrode of the first light-emitting element and a second pixel electrode of the second light-emitting element may be integrally formed with each other, and may be electrically connected to the first pixel circuit.

The first light-emitting element may be located in a first column, and the second light-emitting element may be located in a second column different from the first column, and the first light-emitting element and the second light-emitting element may emit light of a first color.

The display apparatus may further include second pixel circuit and a third pixel circuit arranged on the substrate, wherein the second pixel circuit is configured to commonly apply driving current to a third light-emitting element and a fourth light-emitting element located in a third column between the first column and the second column from among the plurality of light-emitting elements, and the third pixel circuit is configured to commonly apply driving current to a fifth light-emitting element located in the first row and the second column and a sixth light-emitting element located in the second row and the first column from among the plurality of light-emitting elements, wherein the third light-emitting element and the fourth light-emitting element emit light of a second color different from the first color, and the third pixel circuit is configured to commonly apply driving current to a fifth light-emitting element located in the first row and the second column and a sixth light-emitting element located in the second row and the first column from among the plurality of light-emitting elements, wherein the third light-emitting element and the fourth light-emitting element emit light of a second color different from the first color, and the fifth light-emitting element and the sixth light-emitting element emit light of a third color different from the first color and the second color.

The display apparatus may further include a scan line located on the substrate and extending in a row direction, wherein the scan line is electrically connected to all of the first through third pixel circuits.

The display apparatus may further include first through third data lines extending in a column direction and spaced apart from one another, wherein the first through third pixel circuits are respectively electrically connected to the first through third data lines.

The display apparatus may further include a display area including a first display area and a second display area adjacent to a side of the first display area, and a peripheral area outside the display area, wherein the first pixel circuit is located only in the second display area.

Other aspects, features, and advantages of the present embodiments will become more apparent from the drawings, the claims, and the detailed description.

These general and specific embodiments may be implemented by using a system, an apparatus, or a combination thereof.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
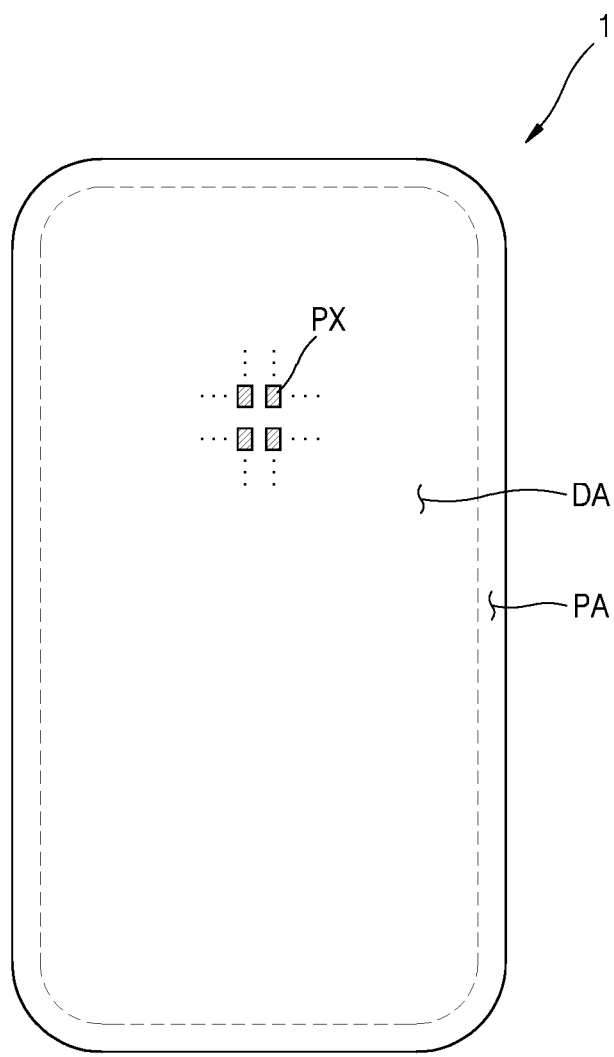
FIG. 1 is a plan view illustrating a display apparatus according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view illustrating a display apparatus according to an embodiment that is constructed according to principles of the invention.

Referring to FIG. 1, a display apparatus 1 may include a display area DA and a peripheral area PA located outside the display area DA. A plurality of pixels PX may be located in the display area DA, and the display area DA may provide a certain image by using light emitted by the plurality of pixels PX.

Each of the pixels PX may be defined as an emission area where a light-emitting element driven by a pixel circuit emits light. Each pixel PX may emit, for example, red light, green light, or blue light. Alternatively, each pixel PX may emit red light, green light, blue light, or white light. An image may be provided by light emitted by each of a plurality of light-emitting elements through the pixel PX.

In an embodiment, the plurality of pixels PX may be arranged in a matrix. For example, the plurality of pixels PX may be two-dimensionally arranged in a row direction (e.g., an x direction) and a column direction (e.g., a y direction). The plurality of light-emitting elements that emit light through the pixels PX may also be arranged in a matrix.

The peripheral area PA may be an area where an image is not provided. The peripheral area PA may be located outside the display area DA, and may entirely or partially surround the display area DA. A driver or the like for applying an electrical signal or power to the display area DA may be located in the peripheral area PA. A pad unit to which an electronic element or a printed circuit board may be electrically connected may be located in the peripheral area PA Although the display apparatus 1 may have a quadrangular shape in a plan view as shown in FIG. 1, the embodiment is not limited thereto. The display apparatus 1 may have any of various planar shapes such as a polygonal shape (e.g., a triangular shape), a circular shape, an elliptical shape, or an irregular shape in a plan view. For example, the display apparatus 1 may have a quadrangular shape having a short side in the x direction and a long side in the y direction. In some embodiments, a corner of the display apparatus 1 may be round.

Although the following is described assuming that the display apparatus 1 includes an organic light-emitting diode OLED as a light-emitting element, the display apparatus 1 of the embodiment is not limited thereto. In another embodiment, the display apparatus 1 may be a light-emitting display apparatus including an inorganic light-emitting diode, that is, an inorganic light-emitting display apparatus. The inorganic light-emitting diode may include a PN junction diode including inorganic semiconductor-based materials. When a voltage is applied to the PN junction diode in a forward direction, holes and electrons may be injected, and energy generated by recombination of the holes and the electrons may be converted into light energy to emit light of a certain color. The inorganic light-emitting diode may have a width of several to hundreds of micrometers. In some embodiments, the inorganic light-emitting diode may be referred to as a micro-LED. In another embodiment, the display apparatus 1 may be a quantum-dot light-emitting display apparatus.

The display apparatus 1 may be used as a display screen of not only a portable electronic device such as a mobile phone, a smartphone, a tablet personal computer (PC), a mobile communication terminal, an electronic organizer, an electronic book, a portable multimedia player (PMP), a navigation device, or an ultra-mobile PC (UMPC) but also any of various products such as a television, a laptop computer, a monitor, an advertisement board, or an Internet of things (IoT) product. Also, the display apparatus 1 according to an embodiment may be used in a wearable device such as a smart watch, a watch phone, a glasses-type display, or a head-mounted display (HMD). Also, the display apparatus 1 according to an embodiment may be used as a center information display (CID) located on an instrument panel, a center fascia, or a dashboard of a vehicle, a room mirror display replacing a side-view mirror of a vehicle, or a display located on the back of a front seat for entertainment for a back seat of a vehicle.

Figure 2:
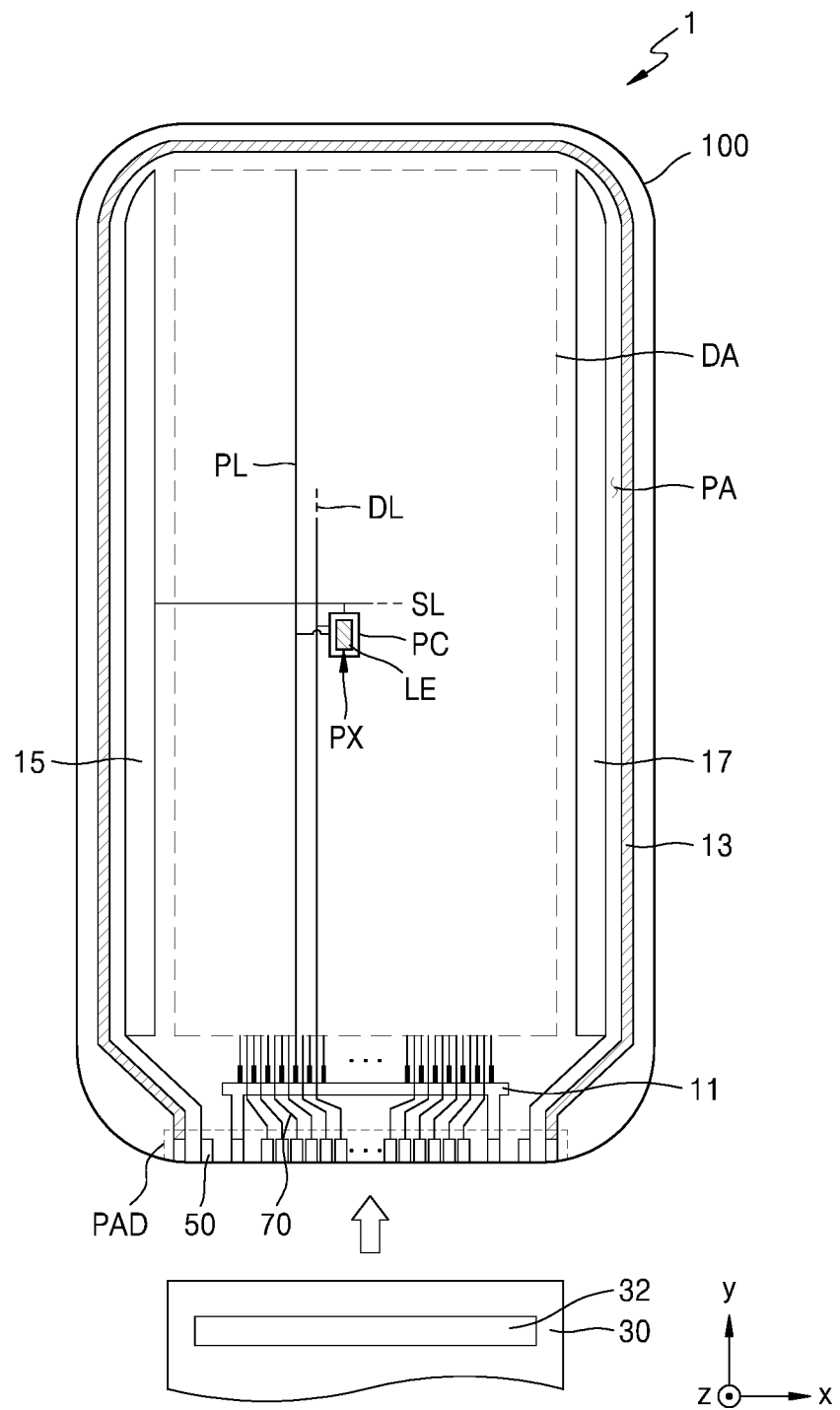
FIG. 2 is a plan view illustrating a display apparatus according to an embodiment.

FIG. 2 is a plan view illustrating a display apparatus according to an embodiment.

Referring to FIG. 2, various elements of the display apparatus 1 may be located on a substrate 100. In an embodiment, a plurality of pixel circuits PC, a plurality of light-emitting elements LE driven by each pixel circuit PC, and a plurality of signal lines and/or a plurality of voltage lines passing through the display area DA may be located on the substrate 100 in the display area DA. Each pixel circuit PC may be electrically connected to signal lines, for example, a data line DL and a scan line SL. Also, each pixel circuit PC may be electrically connected to a voltage line, for example, a driving voltage line PL. Each pixel circuit PC may be electrically connected to the light-emitting element LE, and may drive the light-emitting element LE. The light-emitting element LE may be, for example, an organic light-emitting diode OLED. Although one light-emitting element LE and one pixel circuit PC overlap each other in a plan view of FIG. 2, the embodiment is not limited thereto.

In an embodiment, a first scan driving circuit 15, a second scan driving circuit 17, a pad unit PAD, a driving voltage supply line 11, a common voltage supply line 13, and a fan-out wiring unit 70 for electrically connecting the pad unit PAD to the signal lines may be located on the substrate 100 in the peripheral area PA. Each pixel circuit PC of the display area DA may be electrically connected to outer circuits located in the peripheral area PA through the signal line and/or the voltage line.

The first scan driving circuit 15 may apply a scan signal to each pixel circuit PC through the scan line SL passing through the display area DA. The second scan driving circuit 17 may be located opposite to the first scan driving circuit 15 with the display area DA therebetween, and may be substantially parallel to the first scan driving circuit 15. Some of the pixel circuits PC located in the display area DA may be electrically connected to the first scan driving circuit 15, and the others may be electrically connected to the second scan driving circuit 17. The second scan driving circuit 17 may be omitted.

The pad unit PAD may be located on a side of the substrate 100. The pad unit PAD may include a plurality of pad electrode layers 50. The plurality of pad electrode layers 50 are exposed without being covered by an insulating layer, and are connected to a display circuit board 30. A display driver 32 may be located on the display circuit board 30. The display driver 32 may generate a control signal transmitted to the first scan driving circuit 15 and the second scan driving circuit 17. Also, the display driver 32 may supply a driving voltage ELVDD (see FIG. 3) to the driving voltage supply line 11, and may supply a common voltage ELVSS (see FIG. 3) to the common voltage supply line 13. The driving voltage ELVDD may be applied to the pixel circuit PC through the driving voltage line PL connected to the driving voltage supply line 11, and the common voltage ELVSS may be applied to an opposite electrode of the organic light-emitting diode OLED connected to the common voltage supply line 13. The display driver 32 may generate a data signal, and the generated data signal may be transmitted to the pixel circuit PC through the fan-out wiring unit 70 and the data line DL connected to the fan-out wiring unit 70 and passing through the display area DA.

The driving voltage supply line 11 may located below the display area DA and may extend in the x-direction. The common voltage supply line 13 may have a loop shape with an open side, and may partially surround the display area DA.

Figure 3:
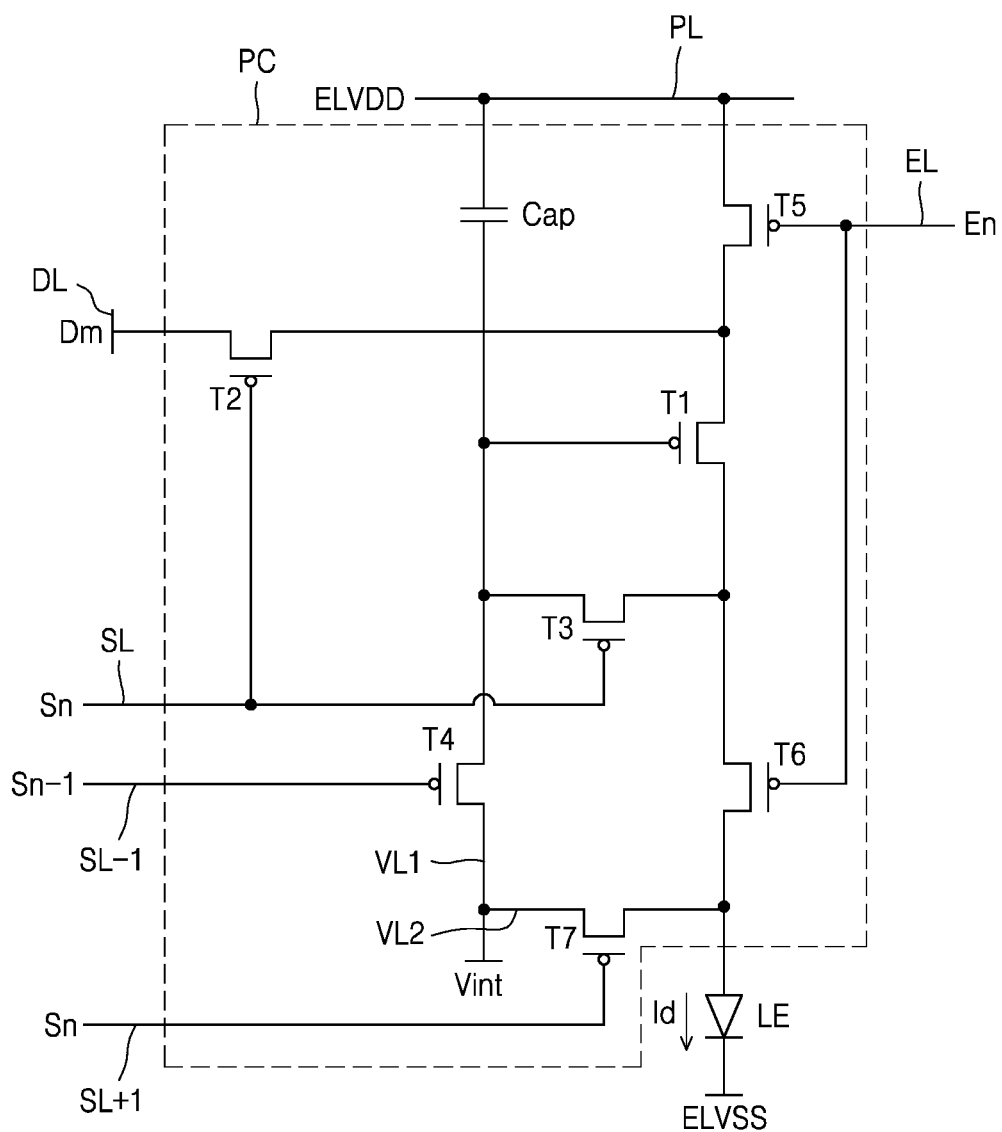
FIG. 3 is an equivalent circuit diagram illustrating a pixel circuit provided in a display apparatus, according to an embodiment.

FIG. 3 is an equivalent circuit diagram illustrating a pixel circuit provided in a display apparatus, according to an embodiment.

Referring to FIG. 3, the pixel circuit PC of the display apparatus 1 (see FIG. 2) may include a plurality of thin-film transistors and a storage capacitor Cap. The pixel circuit PC may drive the light-emitting element LE. That is, the pixel circuit PC may apply driving current Id to the light-emitting element LE, and thus light-emitting element LE may accordingly emit light.

According to an embodiment, the pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

A gate electrode of the driving thin-film transistor T1 may be connected to an electrode of the storage capacitor Cap, one of a source electrode and a drain electrode of the driving thin-film transistor T1 may be connected to the driving voltage line PL via the operation control thin-film transistor T5, and the other of the source electrode and the drain electrode of the driving thin-film transistor T1 may be electrically connected to a pixel electrode of the light-emitting element LE via the emission control thin-film transistor T6. The driving thin-film transistor T1 receives a data signal Dm according to a switching operation of the switching thin-film transistor T2 and supplies the driving current Id to the light-emitting element LE.

A gate electrode of the switching thin-film transistor T2 may be connected to the scan line SL, one of a source electrode and a drain electrode of the switching thin-film transistor T2 may be connected to the data line DL, and the other of the source electrode and the drain electrode of the switching thin-film transistor T2 may be connected to the driving thin-film transistor T1 and may be connected to the driving voltage line PL via the operation control thin-film transistor T5. The switching thin-film transistor T2 may be turned on according to a scan signal Sn received through the scan line SL and may perform a switching operation of transmitting the data signal Dm to the driving thin-film transistor T1.

A gate electrode of the compensation tin film transistor T3 may be connected to the scan line SL, one of a source electrode and a drain electrode of the compensation thin-film transistor T3 may be connected to the driving thin-film transistor T1 and may be connected to the pixel electrode of the light-emitting element LE via the emission control thin-film transistor T6, and the other of the source electrode and the drain electrode of the compensation thin-film transistor T3 may be connected to an electrode of the storage capacitor Cap, the first initialization thin-film transistor T4, and the driving thin-film transistor T1. The compensation thin-film transistor T3 may be turned on according to the scan signal Sn received through the scan line SL and may diode-connect the driving thin-film transistor T1 by electrically connecting the gate electrode to one of the source electrode and the drain electrode of the driving thin-film transistor T1.

A gate electrode of the first initialization thin-film transistor T4 may be connected to a previous scan line SL−1, one of a source electrode and a drain electrode of the first initialization thin-film transistor T4 may be connected to a first initialization voltage line VL1, and the other of the source electrode and the drain electrode of the first initialization thin-film transistor T4 may be connected to an electrode of the storage capacitor Cap, the compensation thin-film transistor T3, and the driving thin-film transistor T1. The first initialization thin-film transistor T4 may be turned on according to a previous scan signal Sn−1 received through the previous scan line SL−1 and may perform an initialization operation of initializing a voltage of the gate electrode of the driving thin-film transistor T1 by transmitting an initialization voltage Vint to the gate electrode of the driving thin-film transistor T1.

A gate electrode of the operation control thin-film transistor T5 may be connected to an emission control line EL, one of a source electrode and a drain electrode of the operation control thin-film transistor T5 may be connected to the driving voltage line PL, and the other of the source electrode and the drain electrode of the operation control thin-film transistor T5 may be connected to the driving thin-film transistor T1 and the switching thin-film transistor T2.

A gate electrode of the emission control thin-film transistor T6 may be connected to the emission control line EL, one of a source electrode and a drain electrode of the emission control thin-film transistor T6 may be connected to the driving thin-film transistor T1 and a compensation source electrode S3 of the compensation thin-film transistor T3, and the other of the source electrode and the drain electrode of the emission control thin-film transistor T6 may be connected to the second initialization thin-film transistor T7 and the pixel electrode of the light-emitting element LE.

The operation control thin-film transistor T5 and the emission control thin-film transistor T6 may be simultaneously turned on according to an emission control signal En received through the emission control line EL, so that the driving voltage ELVDD is supplied to the light-emitting element LE and the driving current Id flows through the light-emitting element LE.

A gate electrode of the second initialization thin-film transistor T7 may be connected to a scan line, that is, a next scan line SL+1, of a pixel circuit located in a row next to the pixel circuit PC. Also, one of a source electrode and a drain electrode of the second initialization thin-film transistor T7 may be connected to the emission control thin-film transistor T6 and the pixel electrode of the light-emitting element LE, and the other of the source electrode and the drain electrode of the second initialization thin-film transistor T7 may be connected to a second initialization voltage line VL2.

The scan line SL and the next scan line SL+1 may be electrically connected to each other, and the same scan signal Sn may be applied to the scan line SL and the next scan line SL+1. Accordingly, the second initialization thin-film transistor T7 may be turned on according to the scan signal Sn received through the next scan line SL+1 and may perform an operation of initializing the pixel electrode of the organic light-emitting diode OLED.

Alternatively, the first initialization thin-film transistor T4 and the second initialization thin-film transistor T7 may be connected to the previous scan line SL−1.

One electrode of the storage capacitor Cap may be connected to the driving voltage line PL, and an opposite electrode of the light-emitting element LE may be connected to the common voltage ELVSS. Accordingly, the light-emitting element LE may receive the driving current Id from the driving thin-film transistor T1 to emit light and display an image.

Although the pixel circuit PC includes seven thin-film transistors (i.g.t, T1 through T7) and one storage capacitor Cap in FIG. 3, the embodiment is not limited thereto. The number of thin-film transistors and storage capacitors may be modified in various ways according to a design of the pixel circuit PC.

Figure 4:
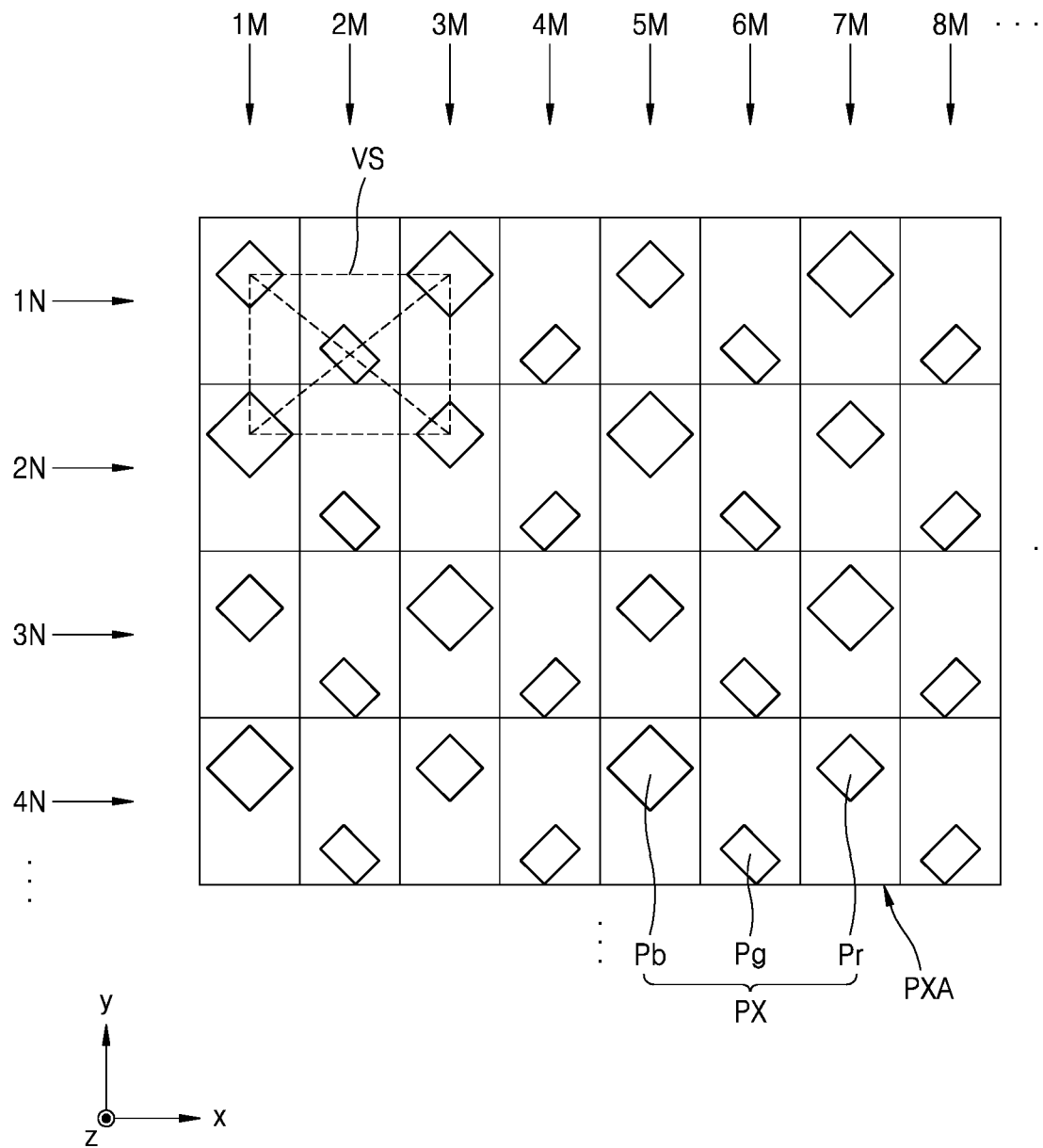
FIG. 4 is a plan view illustrating an arrangement of pixels of a display apparatus, according to an embodiment.

FIG. 4 is a plan view illustrating an arrangement of pixels of a display apparatus, according to an embodiment.

Referring to FIG. 4, the plurality of pixels PX may be located in the display area DA. The pixel PX that is a minimum unit for displaying an image may refer to a sub-pixel, and may be defined as an emission area where light is emitted by the light-emitting element LE (see FIG. 2) as described above. Accordingly, an arrangement of the pixels PX described below may be similar to or substantially the same as an arrangement of the light-emitting elements LE.

In an embodiment, the plurality of pixels PX may include a red pixel Pr, a green pixel Pg, and a blue pixel Pb. The red pixel Pr, the green pixel Pg, and the blue pixel Pb may respectively emit red light, green light, and blue light.

In an embodiment, the display area DA may be divided into a plurality of pixel areas PXA. One pixel PX may be correspondingly located in each pixel area PXA. Although one pixel area PXA has a rectangular shape in a plan view as shown in FIG. 4, the embodiment is not limited thereto. One pixel area PXA may have any of polygonal shapes such as a triangular shape, a square shape, or a pentagonal shape.

The plurality of pixel areas PXA may be arranged in a matrix. For example, the plurality of pixel areas PXA may be two-dimensionally arranged in the row direction (e.g., the x direction) and the column direction (e.g., the y direction). FIG. 4 illustrates the plurality of pixel areas PXA arranged in first through fourth rows 1N through 4N which are adjacent to one another and in first through eighth columns 1M through 8M which are adjacent to one another. The number of rows and columns in which the pixel areas PXA are arranged may be determined according to a resolution and a design of the display apparatus 1.

In an embodiment, in the first row 1N, the red pixel Pr, the green pixel Pg, to blue pixel Pb, and the green pixel Pg may be alternately and repeatedly arranged. The red pixels Pr, green pixels Pg, and the blue pixels Pb may be alternately arranged in a zigzag shape in the row direction to be spaced apart from one another by a certain interval. In the second row 2N, the blue pixel Pb, the green pixel Pg, the red pixel Pr, and the green pixel Pg may be alternately and repeatedly arranged. The blue pixels Pb, the green pixels Pg, and the red pixels Pr may be alternately arranged in a zigzag shape in the row direction to be spaced apart from one another by a certain interval. A pixel arrangement in the third row 3N may be substantially the same as a pixel arrangement in the first row 1N, and a pixel arrangement in the fourth row 4N may be substantially the same as a pixel arrangement in the second row 2N. Such a pixel arrangement may be repeated till an nth row (where n is a pre-defined positive integer value).

In an embodiment, in the first column 1M, the red pixels Pr and the blue pixels Pb may be alternately and repeatedly arranged. The red pixels Pr and the blue pixels Pb may be spaced apart from one another by a certain interval. In the second column 2M, the green pixels Pg may be spaced apart from one another by a certain interval. A pixel arrangement in the third column 3M may be substantially the same as a pixel arrangement in the first column 1M, and a pixel arrangement in the fourth column 4M may be substantially the same as a pixel arrangement in the second column 2M. Such a pixel arrangement may be repeated till an mth row (where m is a pre-defined positive integer value and may be the same as or different from n).

For example, the blue pixel Pb and the red pixel Pr may be larger than the green pixel Pg, and the blue pixel Pb may be larger than the red pixel Pr.

In other words, the red pixels Pr may be located at first and third vertexes facing each other from among vertexes of a virtual quadrangle VS with a central point of the green pixel Pg as a central point of the virtual quadrangle VS, and the blue pixels Pb may be located at second and fourth vertexes that are the remaining vertexes. In this case, the virtual quadrangle VS may be modified into a rectangle, a rhombus, or a square.

Through this pixel arrangement structure, a rendering driving method that represents a color by sharing adjacent pixels PX may be used, thereby displaying an image having a high resolution with a small number of pixels PX.

Although the plurality of pixels PX are arranged in a structure in FIG. 4, the embodiment is not limited thereto. For example, the plurality of pixels PX may be arranged in any of various structures such as a stripe structure, a mosaic arrangement structure, or a delta arrangement structure.

Figure 5A:
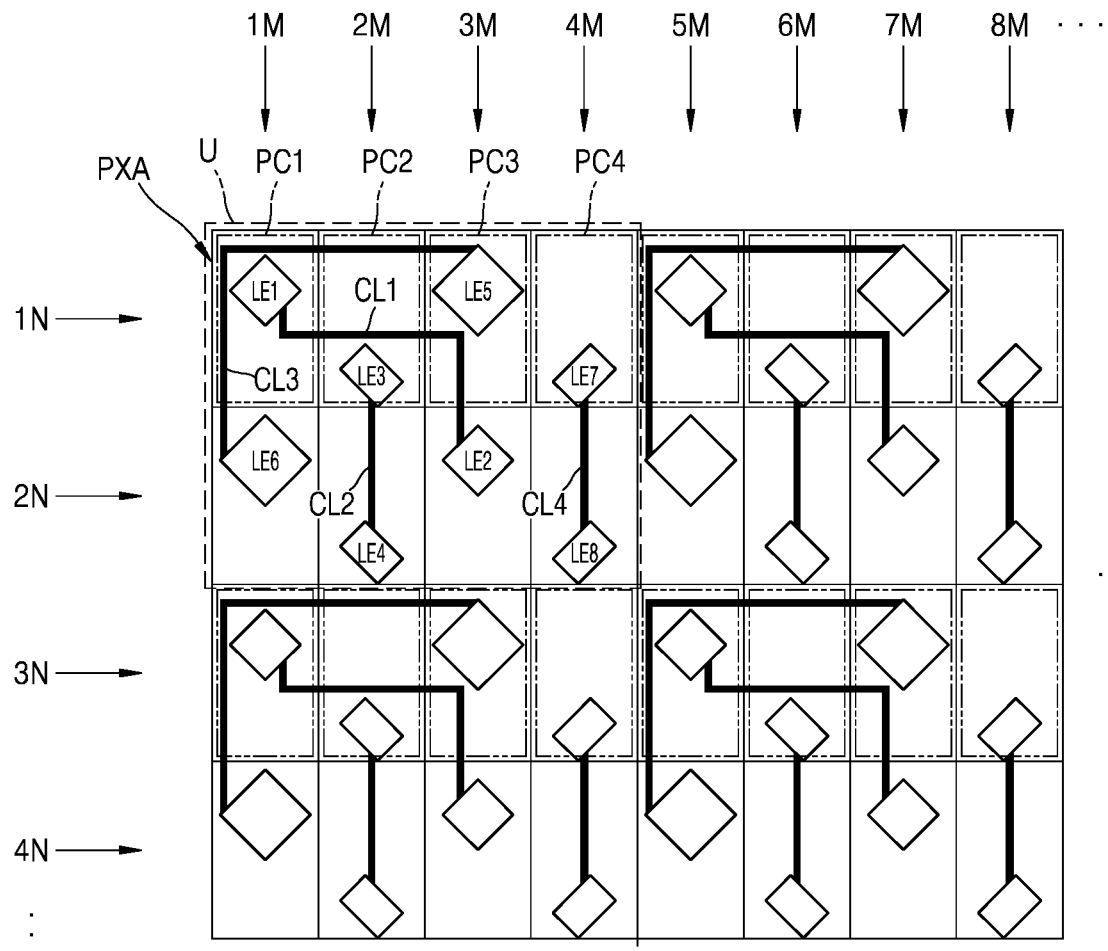
FIGS. 5A and 5B are plan views illustrating an arrangement of some elements of a display apparatus, according to an embodiment.
Figure 5B:
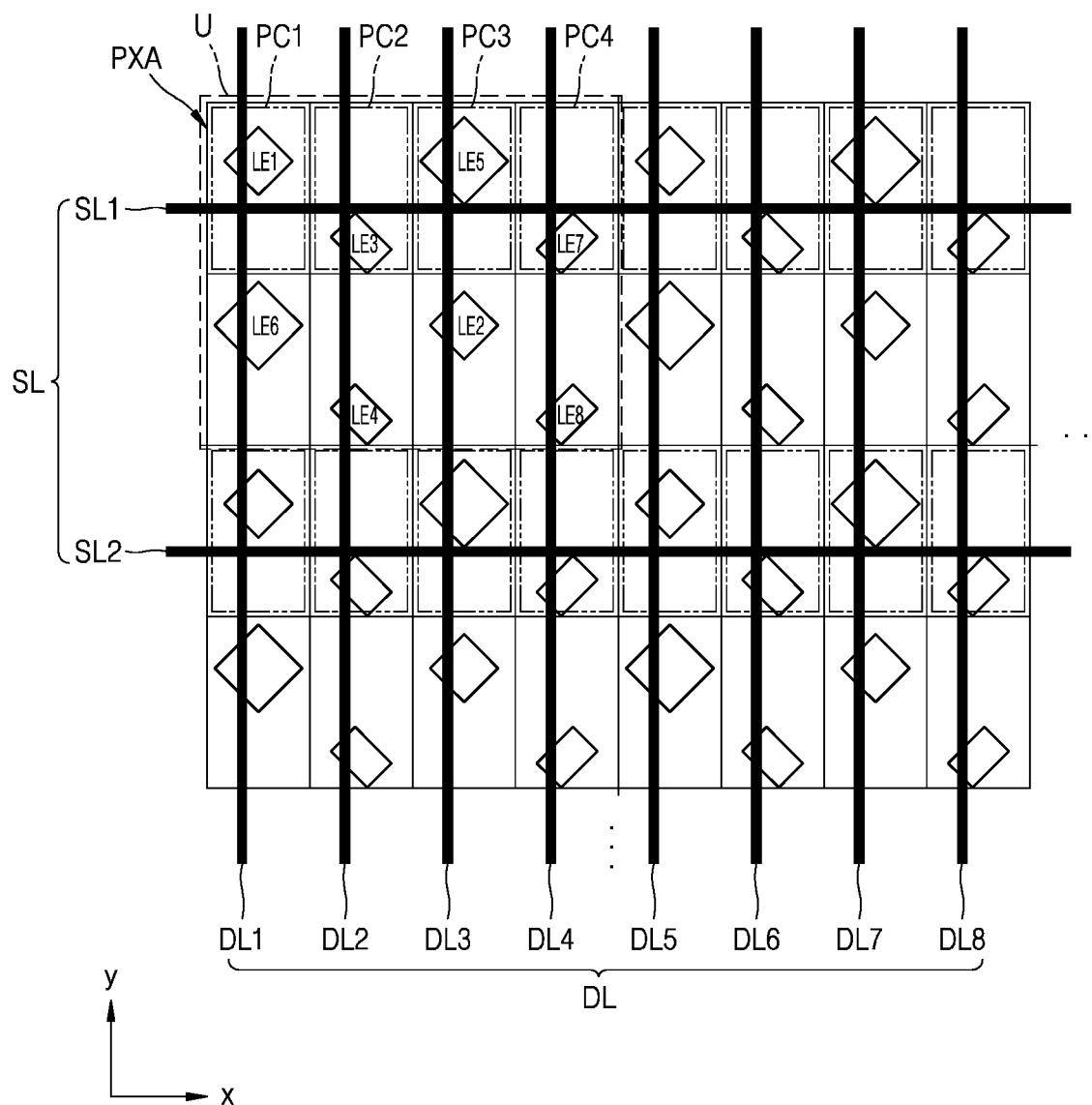

FIGS. 5A and 5B are plan views illustrating an arrangement of some elements of a display apparatus, according to an embodiment. FIG. 5A illustrates an arrangement of the pixel circuit PC and the light-emitting element LE of the display apparatus 1. FIG. 5B illustrates an arrangement of the scan line SL and the data line DL, along with the pixel circuit PC and the light-emitting element LE of the display apparatus 1. The same or corresponding elements as those described with reference to FIG. 4 are denoted by the same reference numerals, and thus a repeated description thereof will be omitted for ease in explanation of these figures.

Referring to FIG. 5A, a plurality of light-emitting elements LE may be arranged to respectively correspond to a plurality of pixel areas PXA arranged in a matrix. That is, the plurality of light-emitting elements LE may be arranged in a matrix on the substrate 100 (see FIG. 2). For example, the plurality of light-emitting elements LE may be two-dimensionally arranged in the row direction (e.g., the x direction) and the column direction (e.g., the y direction). An arrangement of the plurality of light-emitting elements LE may be similar to or substantially the same as an arrangement of the pixels PX described with reference to FIG. 4.

In an embodiment, a set of a certain number of pixel areas PXA may be defined as one basic unit U. The basic unit U may be repeatedly arranged in the row direction (e.g., the x direction) and the column direction (e.g., the y direction). For example, as shown in FIG. 5A, eight pixel areas PXA may constitute one basic unit U. In this case, the basic unit U may be a set of pixel areas PXA arranged in two rows and four columns, and may include elements located in the eight pixel areas PXA. For example, the basic unit U may include eight light-emitting elements, for example, first through eighth LE1, LE2, LE3, LE4, LE5, LE6, LE7, and LE8. In FIG. 5A, four basic units U are illustrated. Hereinafter, one basic unit U will be described.

According to an embodiment, each of the plurality of pixel circuits PC may commonly drive (or control) a plurality of light-emitting elements LE. In an embodiment, the basic unit U of the display apparatus 1 (see FIG. 2) may include a first pixel circuit PC1 on the substrate 100 (see FIG. 2), and the first pixel circuit PC1 may commonly drive the first light-emitting element LE1 arranged in a first row 1N and the second light-emitting element LE2 arranged in a second row 2N different from the first row 1N from among the plurality of light-emitting elements LE. For example, the first row 1N and the second row 2N may be adjacent to each other. That is, the first light-emitting element LE1 and the second light-emitting element LE2 arranged in different rows may be commonly driven (or controlled) by one pixel circuit, for example, the first pixel circuit PC1. According to an embodiment, the first light-emitting element LE1 may be arranged in a first column 1M, and the second light-emitting element LE2 may be arranged in a third column 3M different from the first column 1M. That is, the first light-emitting element LE1 and the second light-emitting element LE2 arranged in different columns may be commonly driven (or controlled) by one pixel circuit, for example, the first pixel circuit PC1.

In an embodiment, a plurality of light-emitting elements LE commonly driven by one pixel circuit PC may be electrically connected to one another. For example, the first light-emitting element LE1 and the second light-emitting element LE2 may be electrically connected to each other. To this end, in some embodiments, a first conductive layer CL1 for electrically connecting the first light-emitting element LE1 to the second light-emitting element LE2 may be provided. The first conductive layer CL1 may also be electrically connected to the first pixel circuit PC1. The first conductive layer CL1 may extend from the first light-emitting element LE1 to the second light-emitting element LE2 in a plan view. In another embodiment, a pixel electrode of the first light-emitting element LE1 and a pixel electrode of the second light-emitting element LE2 may be integrally formed with each other, so that the first light-emitting element LE1 and the second light-emitting element LE2 are electrically connected to each other.

According to an embodiment, the basic unit U of the display apparatus 1 may include a second pixel circuit PC2 on the substrate 100, and the second pixel circuit PC2 may commonly drive the third light-emitting element LE3 and the fourth light-emitting element LE4 arranged in a second column 2M between the first column 1M and the third column 3M from among the plurality of light-emitting elements LE. According to an embodiment, the third light-emitting element LE3 may be arranged in the first row 1N, and the fourth light-emitting element LE4 may be arranged in the second row 2N different from the first row 1N. That is, the third light-emitting element LE3 and the fourth light-emitting element LE4 arranged in different rows and in the same column may be commonly driven (or controlled) by one pixel circuit, for example, the second pixel circuit PC2.

In an embodiment, a plurality of light-emitting elements LE commonly driven by one pixel circuit PC may be electrically connected to one another. For example, the third light-emitting element LE3 and the fourth light-emitting element LE4 may be electrically connected to each other. To this end, in some embodiments, a second conductive layer CL2 for electrically connecting the third light-emitting element LE3 to the fourth light-emitting element LE4 may be provided. The second conductive layer CL2 may also be electrically connected to the second pixel circuit PC2. The second conductive layer CL2 may extend from the third light-emitting element LE3 to the fourth light-emitting element LE4 in a plan view. In another embodiment, a pixel electrode of the third light-emitting element LE3 and a pixel electrode of the fourth light-emitting element LE4 may be integrally formed with each other, so that the third light-emitting element LE3 and the fourth light-emitting element LE4 are electrically connected to each other.

According to an embodiment, the basic unit U of the display apparatus 1 may include a third pixel circuit PC3 on the substrate 100, and the third pixel circuit PC3 may commonly drive the fifth light-emitting element LE5 arranged in the first row 1N and the third column 3M and the sixth light-emitting element LE6 arranged in the second row 2N and the first column 1M from among the plurality of light-emitting elements LE. That is, the fifth light-emitting element LE5 and the sixth light-emitting element LE6 arranged in different rows and columns may be commonly driven (or controlled) by one pixel circuit, for example, the third pixel circuit PC3.

In an embodiment, a plurality of light-emitting elements LE commonly driven by one pixel circuit PC may be electrically connected to one another. For example, the fifth light-emitting element LE5 and the sixth light-emitting element LE6 may be electrically connected to each other. To this end, in some embodiments, a third conductive layer CL3 for electrically connecting the fifth light-emitting element LE5 to the sixth light-emitting element LE6 may be provided. The third conductive layer CL3 may also be electrically connected to the third pixel circuit PC3. The third conductive layer CL3 may extend from the fifth light-emitting element LE5 to the sixth light-emitting element LE6 in a plan view. In another embodiment, a pixel electrode of the fifth light-emitting element LE5 and a pixel electrode of the sixth light-emitting element LE6 may be integrally formed with each other, so that the fifth light-emitting element LE5 and the sixth light-emitting element LE6 are electrically connected to each other.

According to an embodiment, the basic unit U of the display apparatus 1 may further include a fourth pixel circuit PC4 on the substrate 100, and the fourth pixel circuit PC4 may commonly drive the seventh light-emitting element LE7 and the eighth light-emitting element LE8 arranged in a fourth column 4M from among the plurality of light-emitting elements LE. The fourth column 4M may be adjacent to the third column 3M, and may be spaced apart from the second column 2M with the third column 3M therebetween. According to an embodiment, the seventh light-emitting element LE7 may be arranged in the first row 1N, and the eighth light-emitting element LE8 may be arranged in the second row 2N. That is, the seventh light-emitting element LE7 and the eighth light-emitting element LE8 arranged in different rows and in the same column may be commonly driven (or controlled) by one pixel circuit, for example, the fourth pixel circuit PC4.

In an embodiment, a plurality of light-emitting elements LE commonly driven by one pixel circuit PC may be electrically connected to one another. For example, the seventh light-emitting element LE7 and the eighth light-emitting element LE8 may be electrically connected to each other. To this end, in some embodiments, a fourth conductive layer CL4 for electrically connecting the seventh light-emitting element LE7 to the eighth light-emitting element LE8 may be provided. The fourth conductive layer CL4 may also be electrically connected to the fourth pixel circuit PC4. The fourth conductive layer CL4 may extend from the seventh light-emitting element LE7 to the eighth light-emitting element LE8 in a plan view. In another embodiment, a pixel electrode of the seventh light-emitting element LE7 and a pixel electrode of the eighth light-emitting element LE8 may be integrally formed with each other, so that the seventh light-emitting element LE7 and the eighth light-emitting element LE8 are electrically connected to each other.

According to an embodiment, the first light-emitting element LE1 and the second light-emitting element LE2 may emit light of the same first color. The third light-emitting element LE3 and the fourth light-emitting element LE4 may emit light of the same second color, and the second color may be different from the first color. The fifth light-emitting element LE5 and the sixth light-emitting element LE6 may emit light of the same third color, and the third color may be different from the first color and the second color. For example, the seventh light-emitting element LE7 and the eighth light-emitting element LE8 may emit light of the same second color. Each of the first through third colors may be any of red, green, and blue, or any of red, green, blue, and white. For example, the first color may be red, the second color may be green, and the third color may be blue.

As a comparative example, when the pixel circuits PC whose number is the same as the number of the light-emitting elements LE are provided, there may be a restriction that a size of the pixel circuits (i.e., an area occupied by the pixel circuits in a plan view) should be reduced in order to increase a resolution of a display apparatus having a limited size.

However, according to an embodiment, eight light-emitting elements, for example, the first through eighth light-emitting elements LE1, LE2, LE3, LE4, LE5, LE6, LE7, and LE8, may be driven by using four pixel circuits, for example, the first through fourth pixel circuits PC1, PC2, PC3, and PC4. That is, the display apparatus 1 may include the pixel circuits PC whose number is less than the number of the light-emitting elements LE. Accordingly, a resolution of the display apparatus 1 may be increased, without reducing a size of the pixel circuits PC. With more freedom from the restriction on the size of the pixel circuits PC, a degree of freedom in designing the pixel circuit PC may increase, the pixel circuit PC may include more thin-film transistors, and thus the pixels PX may be stably and effectively controlled. Also, as a resolution of the display apparatus 1 increases, a screen-door effect (SDE) in which a gap between pixels is visible to a user's eyes may be minimized.

Although the first through fourth pixel circuits PC1, PC2, PC3, and PC4 of the basic unit U are aligned in the row direction (e.g., the x direction) in FIG. 5A, the embodiment is not limited thereto. The plurality of pixel circuits PC provided in the basic unit U may be arranged in any of various shapes. Also, although one pixel circuit PC is arranged to correspond to one pixel area PXA in FIG. 5A, the embodiment is not limited thereto. One pixel circuit PC may be arranged to correspond to two pixel areas PXA, or may be arranged to correspond to a portion of the pixel area PXA.

Referring to FIG. 5B, the display apparatus 1 may include a plurality of scan lines SL extending in the row direction (e.g., the x direction). The plurality of scan lines SL may be spaced apart from one another in the column direction (e.g., the y direction). Each scan line SL may be electrically connected to at least one pixel circuit PC, and may apply a scan signal to the pixel circuit PC. In some embodiments, one scan line SL may be electrically connected to the pixel circuits PC arranged in one row.

Referring to the basic unit U, a first scan line SL1 may be commonly electrically connected to the first through third pixel circuits PC1, PC2, and PC3. Also, the first scan line SL1 may also be electrically connected to the fourth pixel circuit PC4. That is, the first through fourth pixel circuits PC1, PC2, PC3, and PC4 may commonly receive a scan signal applied through the first scan line SL1.

As described above, the basic unit U may be repeatedly arranged in the row direction (e.g., the x direction) and the column direction (e.g., the y direction). The pixel circuits PC of each of the basic units U arranged in the row direction may be commonly electrically connected to the first scan line SL1 extending in the row direction. This arrangement may be repeated in the column direction. That is, a second scan line SL2 spaced apart in the column direction from the first scan line SL1 may also be commonly electrically connected to the pixel circuits PC of each of the basic units U arranged in the row direction.

Through this arrangement, the number of used scan lines SL may be minimized. For example, as shown in FIG. 5B, only one scan line SL may be used to drive the plurality of light-emitting elements LE arranged in two rows.

In general, as a resolution of a display apparatus increases, that is, as the number of light-emitting elements arranged per unit area increases, the number of pixel circuits for driving the light-emitting elements may also need to increase. In this case, the number of used scan lines may also increase. Also, in order to implement a display apparatus having a high aspect ratio, the number of used scan lines may need to increase. In a display apparatus driven at a certain scan rate, as the number of used scan lines increases, a scan-on time (SOT) may decrease and defects such as spots may occur on a displayed image.

However, in an embodiment, the number of the pixel circuits PC for driving the light-emitting elements LE and the number of the scan lines SL connected to the pixel circuits PC may be minimized. Accordingly, a display apparatus having a high resolution and/or a high aspect ratio may be provided, the number of used scan lines SL may be minimized, a decrease in a scan-on time (SOT) may be minimized, and thus defects such as spots may be prevented.

According to an embodiment, the display apparatus 1 may include a plurality of data lines DL extending in the column direction (e.g., the y direction). The plurality of data lines DL may be spaced apart from one another in the row direction (e.g., the x direction). Each data line DL may be electrically connected to at least one pixel circuit PC, and may apply a data signal to the pixel circuit PC. In some embodiments, one data line DL may be electrically connected to the pixel circuits PC arranged in one column.

Referring to the basic unit U, the first through third pixel circuits PC1, PC2, and PC3 may be respectively electrically connected to first through third data lines DL1, DL2, and DL3 that are different from one another. Also, the fourth pixel circuit PC4 may be electrically connected to a fourth data line DL4. That is, the first through fourth pixel circuits PC1, PC2, PC3, and PC4 may respectively individually receive data signals from the first through fourth data lines DL1 through DL4

The data signals applied to the first through fourth pixel circuits PC1, PC2, PC3, and PC4 may be rendered by considering that a plurality of light-emitting elements LE are driven by each of the first through fourth pixel circuits PC1, PC2, PC3, and PC4. For example, the first data line DL1 may apply a data signal rendered by considering a luminance of light to be emitted by each of the first light-emitting element LE1 and the second light-emitting element LE2 to the first pixel circuit PC1. Likewise, the second data line DL2 may apply a data signal rendered by considering a luminance of light to be emitted by each of the third light-emitting element LE3 and the fourth light-emitting element LE4 to the second pixel circuit PC2, the third data line DL3 may apply a data signal rendered by considering a luminance of light to be emitted by each of the fifth light-emitting element LE5 and the sixth light-emitting element LE6 to the third pixel circuit PC3, and the fourth data line DL4 may apply a data signal rendered by considering a luminance of light to be emitted by each of the seventh light-emitting element LE7 and the eighth light-emitting element LE8 to the fourth pixel circuit PC4.

Figure 6:
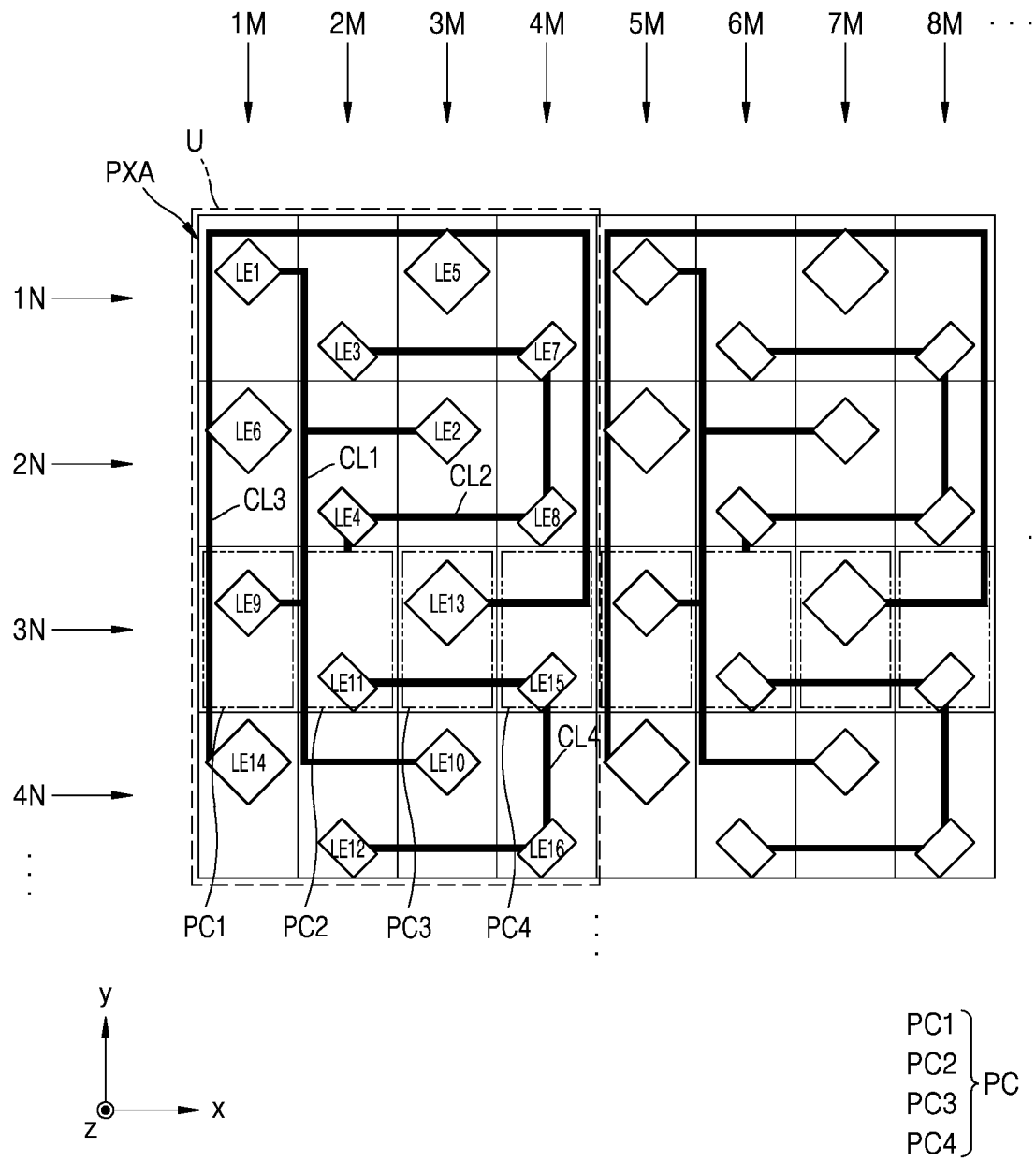
FIG. 6 is a plan view illustrating an arrangement of some elements of a display apparatus, according to another embodiment.

FIG. 6 is a plan view illustrating an arrangement of some elements of a display apparatus, according to another embodiment. A description of the same or corresponding elements as those described with reference to FIG. 5A will be omitted for ease in explanation of this figure, and the following will focus on a difference.

Referring to FIG. 6, 16 pixel areas PXA may constitute one basic unit U. In this case, the basic unit U may be a set of pixel areas PXA arranged in four rows and four columns, and may include elements located in the 16 pixel areas PXA. For example, the basic unit U may include 16 light-emitting elements, for example, first through $16^{th}$ light-emitting elements LE1 through LE16. In FIG. 6, two basic units U are illustrated. Hereinafter, one basic unit U will be described.

According to an embodiment, a first pixel circuit PC1 may commonly drive not only the first light-emitting element LE1 and the second light-emitting element LE2 but also the ninth light-emitting element LE9 and the tenth light-emitting element LE10. That is, the first light-emitting element LE1, the second light-emitting element LE2, the ninth light-emitting element LE9, and the tenth light-emitting element LE10 may be commonly driven (or controlled) by one pixel circuit, for example, the first pixel circuit PC1.

For example, the first light-emitting element LE1, the second light-emitting element LE2, the ninth light-emitting element LE9, and the tenth light-emitting element LE10 may be arranged in different rows. For example, the first light-emitting element LE1 may be arranged in a first row 1N, the second light-emitting element LE2 may be arranged in a second row 2N, the ninth light-emitting element LE9 may be arranged in a third row 3N, and the tenth light-emitting element LE10 may be arranged in a fourth row 4N. For example, the first light-emitting element LE1 and the second light-emitting element LE2 may be arranged in different columns, and the ninth light-emitting element LE9 and the tenth light-emitting element LE10 may be arranged in different columns. For example, the first light-emitting element LE1 and the ninth light-emitting element LE9 may be arranged in a first column 1M, and the second light-emitting element LE2 and the tenth light-emitting element LE10 may be arranged in a third column 3M.

In an embodiment, a plurality of light-emitting elements LE commonly driven by one pixel circuit PC may be electrically connected to one another. For example, the first light-emitting element LE1, the second light-emitting element LE2, the ninth light-emitting element LE9, and the tenth light-emitting element LE10 may be electrically connected to one another. To this end, in some embodiments, a first conductive layer CL1 for electrically connecting the first light-emitting element LE1, the second light-emitting element LE2, the ninth light-emitting element LE9, and the tenth light-emitting element LE10 may be provided. The first conductive layer CL1 may also be electrically connected to the first pixel circuit PC1. The first conductive layer CL1 may extend from the first light-emitting element LE1 to each of the second light-emitting element LE2, the ninth light-emitting element LE9, and the tenth light-emitting element LE10 in a plan view. In another embodiment, pixel electrodes of the first light-emitting element LE1, the second light-emitting element LE2, the ninth light-emitting element LE9, and the tenth light-emitting element LE10 may be integrally formed with one another, so that the first light-emitting element LE1, the second light-emitting element LE2, the ninth light-emitting element LE9, and the tenth light-emitting element LE10 are electrically connected to one another.

According to an embodiment, a second pixel circuit PC2 may commonly drive not only the third light-emitting element LE3 and the fourth light-emitting element LE4 but also, the seventh light-emitting element LE7 and the eighth light-emitting element LE8. That is, the third light-emitting element LE3, the fourth light-emitting element LE4, the seventh light-emitting element LE7, and the eighth light-emitting element LE8 may be commonly driven (or controlled) by one pixel circuit, for example, the second pixel circuit PC2.

For example, the third light-emitting element LE3 and the fourth light-emitting element LE4 may be arranged in different rows, and the seventh light-emitting element LE7 and the eighth light-emitting element LE8 may be arranged in different rows. For example, the third light-emitting element LE3 and the seventh light-emitting element LE7 may be arranged in the first row 1N, and the fourth light-emitting element LE4 and the eighth light-emitting element LE8 may be arranged in the second row 2N. For example, the third light-emitting element LE3 and the seventh light-emitting element LE7 may be arranged in different columns, and the fourth light-emitting element LE4 and the eighth light-emitting element LE8 may be arranged in different columns. For example, the third light-emitting element LE3 and the fourth light-emitting element LE4 may be arranged in a second column 2M, and the seventh light-emitting element LE7 and the eighth light-emitting element LE8 may be arranged in a fourth column 4M.

In an embodiment, a plurality of light-emitting elements LE commonly driven by one pixel circuit PC may be electrically connected to one another. For example, the third light-emitting element LE3, the fourth light-emitting element LE4, the seventh light-emitting element LE7, and the eighth light-emitting element LE8 may be electrically connected to one another. To this end, in some embodiments, a second conductive layer CL2 for electrically connecting the third light-emitting element LE3, the fourth light-emitting element LE4, the seventh light-emitting element LE7, and the eighth light-emitting element LE8 may be provided. The second conductive layer CL2 may also be electrically connected to the second pixel circuit PC2. The second conductive layer CL2 may extend from the third light-emitting element LE3 to each of the fourth light-emitting element LE4, the seventh light-emitting element LE7, and the eighth light-emitting element LE8 in a plan view. Also, the second conductive layer CL2 may extend from any one of the third light-emitting element LE3, the fourth light-emitting element LE4, the seventh light-emitting element LE7, and the eighth light-emitting element LE8 to the second pixel circuit PC2 in a plan view. In another embodiment, pixel electrodes of the first light-emitting element LE1, the second light-emitting element LE2, the ninth light-emitting element LE9, and the tenth light-emitting element LE10 may be integrally formed with one another, so that the first light-emitting element LE1, the second light-emitting element LE2, the ninth light-emitting element LE9, and the tenth light-emitting element LE10 are electrically connected to one another.

According to an embodiment, a third pixel circuit PC3 may commonly drive not only the fifth light-emitting element LE5 and the sixth light-emitting element LE6 but also the 13$^{th}$ light-emitting element LE13 and the 14$^{th}$ light-emitting element LE14. That is, the fifth light-emitting element LE5, the sixth light-emitting element LE6, the 13$^{th}$ light-emitting element LE13, and the 14$^{th}$ light-emitting element LE14 may be commonly driven (or controlled) by one pixel circuit, for example, the third pixel circuit PC3.

For example, the fifth light-emitting element LE5, the sixth light-emitting element LE6, the 13$^{th}$ light-emitting element LE13, and the 14$^{th}$ light-emitting element LE14 may be arranged in different rows. For example, the fifth light-emitting element LE5 may be arranged in the first row 1N, the sixth light-emitting element LE6 may be arranged in the second row 2N, the 13$^{th}$ light-emitting element LE13 may be arranged in the third row 3N, and the 14$^{th}$ light-emitting element LE14 may be arranged in the fourth row 4N. For example, the fifth light-emitting element LE5 and the sixth light-emitting element LE6 may be arranged in different columns, and the 13$^{th}$ light-emitting element LE13 and the 14$^{th}$ light-emitting element LE14 may be arranged in different columns. For example, the fifth light-emitting element LE5 and the 13$^{th}$ light-emitting element LE13 may be arranged in the third column 3M, and the sixth light-emitting element LE6 and the 14$^{th}$ light-emitting element LE14 may be arranged in the first column 1M.

In an embodiment, a plurality of light-emitting elements LE commonly driven by one pixel circuit PC may be electrically connected to one another. For example, the fifth light-emitting element LE5, the sixth light-emitting element LE6, the 13$^{th}$ light-emitting element LE13, and the 14$^{th}$ light-emitting element LE14 may be electrically connected to one another. To this end, in some embodiments, a third conductive layer CL3 for electrically connecting the fifth light-emitting element LE5, the sixth light-emitting element LE6, the 13th light-emitting element LE13, and the 14th light-emitting element LE14 may be provided. The third conductive layer CL3 may also be electrically connected to the third pixel circuit PC3. The third conductive layer CL3 may extend from the fifth light-emitting element LE5 to each of the sixth light-emitting element LE6, the 13$^{th}$ light-emitting element LE13, and the 14$^{th}$ light-emitting element LE14 in a plan view. In another embodiment, pixel electrodes of the fifth light-emitting element LE5, the sixth light-emitting element LE6, the 13$^{th}$ light-emitting element LE13, and the 14$^{th}$ light-emitting element LE14 may be integrally formed with one another, so that the fifth light-emitting element LE5, the sixth light-emitting element LE6, the 13$^{th}$ light-emitting element LE13, and the 14$^{th}$ light-emitting element LE14 are electrically connected to one another.

According to an embodiment, a fourth pixel circuit PC4 may commonly drive the 11$^{th}$ light-emitting element LE11, the 12$^{th}$ light-emitting element LE12, the 15$^{th}$ light-emitting element LE15, and the 16$^{th}$ light-emitting element LE16. That is, the 11$^{th}$ light-emitting element LE11, the 12$^{th}$ light-emitting element LE12, the 15$^{th}$ light-emitting element LE15, and the 16$^{th}$ light-emitting element LE16 may be commonly driven (or controlled) by one pixel circuit, for example, the fourth pixel circuit PC4.

For example, the 11$^{th}$ light-emitting element LE11 and the 12$^{th}$ light-emitting element LE12 may be arranged in different rows, and the 15$^{th}$ light-emitting element LE15 and the 16$^{th}$ light-emitting element LE16 may be arranged in different rows. For example, the 11$^{th}$ light-emitting element LE11 and the 15$^{th}$ light-emitting element LE15 may be arranged in the third row 3N, and the 12$^{th}$ light-emitting element LE12 and the 16$^{th}$ light-emitting element LE15 may be arranged in the fourth row 4N. For example, the 11$^{th}$ light-emitting element LE11 and the 15$^{th}$ light-emitting element LE15 may be arranged in different columns, and the 12$^{th}$ light-emitting element LE12 and the 16$^{th}$ light-emitting element LE16 may be arranged in different columns. For example, the 11$^{th}$ light-emitting element LE11 and the 12$^{th}$ light-emitting element LE12 may be arranged in the second column 2M, and the 15$^{th}$ light-emitting element LE15 and the 16$^{th}$ light-emitting element LE16 may be arranged in the fourth column 4M.

In an embodiment, a plurality of light-emitting elements LE commonly driven by one pixel circuit PC may be electrically connected to one another. For example, the 11$^{th}$ light-emitting element LE11, the 12$^{th}$ light-emitting element LE12, the 15$^{th}$ light-emitting element LE15, and the 16$^{th}$ light-emitting element LE16 may be electrically connected to one another. To this end, in some embodiments, a fourth conductive layer CL4 for electrically connecting the 11$^{th}$ light-emitting element LE11, the 12$^{th}$ light-emitting element LE12, the 15$^{th}$ light-emitting element LE15, and the 16$^{th}$ light-emitting element LE16 may be provided. The fourth conductive layer CL4 may also be electrically connected to the fourth pixel circuit PC4. The fourth conductive layer CL4 may extend from the 11$^{th}$ light-emitting element LE11 to each of the 12$^{th}$ light-emitting element LE12, the 15$^{th}$ light-emitting element LE15, and the 16$^{th}$ light-emitting element LE16 in a plan view. In another embodiment, pixel electrodes of the 11$^{th}$ light-emitting element LE11, the 12$^{th}$ light-emitting element LE12, the 15$^{th}$ light-emitting element LE15, and the 16$^{th}$ light-emitting element LE16 may be integrally formed with one another, so that the 11$^{th}$ light-emitting element LE11, the 12$^{th}$ light-emitting element LE12, the 15$^{th}$ light-emitting element LE15, and the 16$^{th}$ light-emitting element LE16 are electrically connected to one another.

According to an embodiment, the first light-emitting element LE1, the second light-emitting element LE2, the 9$^{th}$ light-emitting element LE9, and the 10$^{th}$ light-emitting element LE10 may emit of the same first color. The third light-emitting element LE3, the fourth light-emitting element LE4, the seventh light-emitting element LE7, and the eighth light-emitting element LE8 may emit light of the same second color, and the second color may be different from the first color. The fifth light-emitting element LE5, the sixth light-emitting element LE6, the 13$^{th}$ light-emitting element LE13, and the 14$^{th}$ light-emitting element LE14 may emit light of the same third color, and the third color may be different from the first color and the second color. For example, the 11$^{th}$ light-emitting element LE11, the 12$^{th}$ light-emitting element LE12, the 15$^{th}$ light-emitting element LE15, and the 16$^{th}$ light-emitting element LE16 may emit light of the same second color. Each of the first through third colors may be any one of red, green, and blue, or any one of red, green, blue, and white. For example, the first color may be red, the second color may be green, and the third color may be blue.

As such, 16 light-emitting elements, for example, the first through 16$^{th}$ light-emitting elements LE1 through LE16, may be driven by using four pixel circuits, for example, the first through fourth pixel circuits PC1, PC2, PC3, and PC4. That is, the display apparatus 1 may include the pixel circuits PC whose number is less than the number of the light-emitting elements LE.

Although not shown in FIG. 6, in an embodiment, one scan line SL (see FIG. 5B) may be common electrically connected to the first through fourth pixel circuits PC1, PC2, PC3, and PC4, and thus the first through fourth pixel circuits PC1, PC2, PC3, and PC4 may commonly receive a scan signal from the one scan line SL. Accordingly, only one scan line SL may be used to drive the light-emitting elements LE arranged in four rows.

In order to implement the display apparatus 1 having a high aspect ratio, the number of used scan lines SL may need to increase. In the display apparatus 1 driven at a certain scan rate, as the number of used scan lines SL increases, a scan-on time (SOT) may decrease and defects such as spots may occur on a displayed image. However, according to an embodiment, because the number of used scan lines SL is minimized, defects such as spots may be prevented and the display apparatus 1 having a high resolution and a high aspect ratio may be provided.

Figure 7:
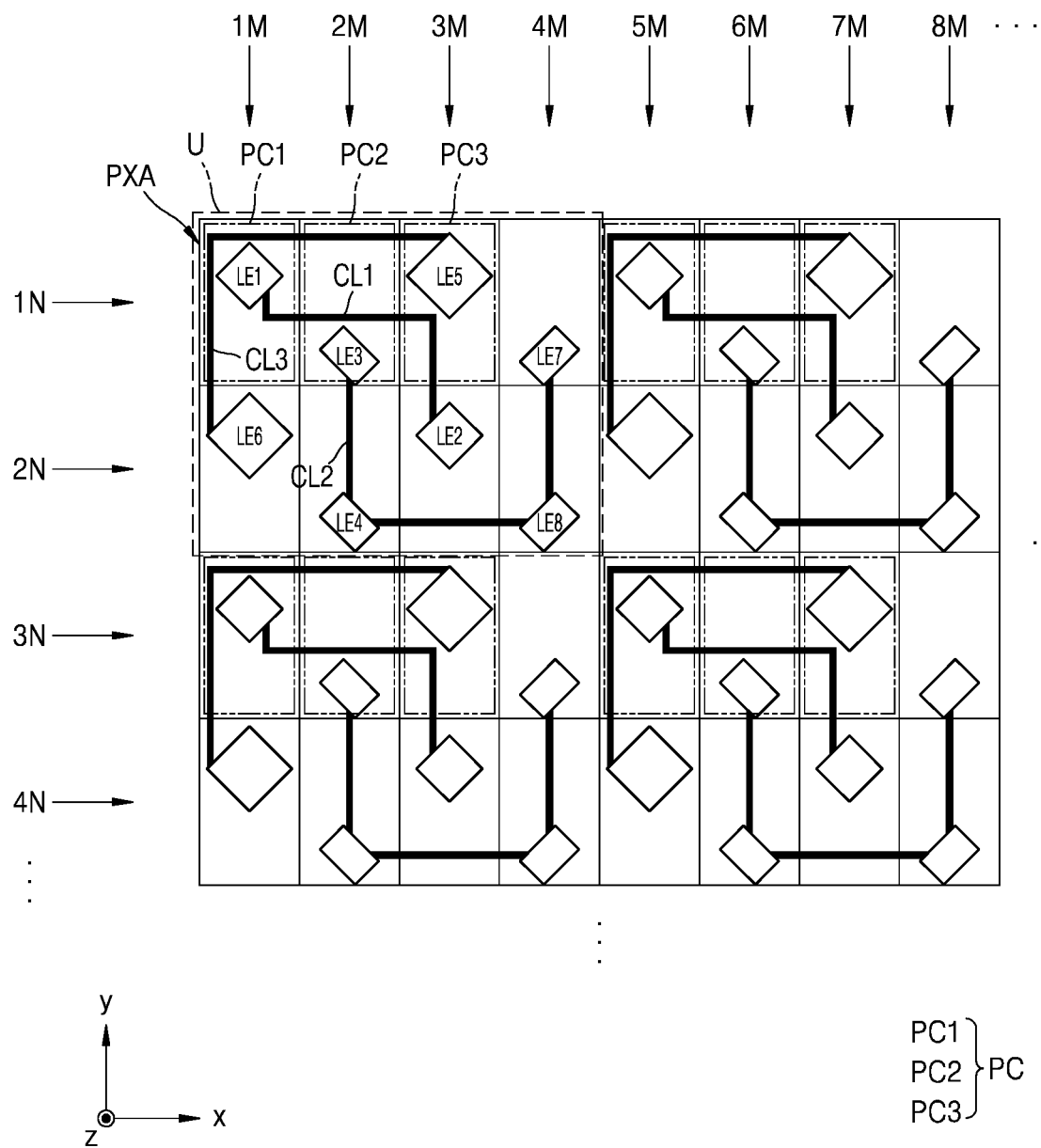
FIG. 7 is a plan view illustrating an arrangement of some elements of a display apparatus, according to another embodiment.

FIG. 7 is a plan view illustrating an arrangement of some elements of a display apparatus, according to another embodiment. A description of the same or corresponding elements as those described with reference to FIG. 5A will be omitted for ease in explanation of this figure, and the following will focus on a difference.

Referring to FIG. 7, a second pixel circuit PC2 may commonly drive not only the third light-emitting element LE3 and the fourth light-emitting element LE4 but also the seventh light-emitting element LE7 and the eighth light-emitting element LE8. Accordingly, the basic unit U may include three pixel circuits, for example, first through third pixel circuits PC1, PC2, and PC3. The third light-emitting element LE3, the fourth light-emitting element LE4, the seventh light-emitting element LE7, and the eighth light-emitting element LE8 may be electrically connected to one another by a second conductive layer CL2, and to this end, the second conductive layer CL2 may extend from the third light-emitting element LE3 to each of the fourth light-emitting element LE4, the seventh light-emitting element LE7, and the eighth light-emitting element LE8 in a plan view.

As such, all of the third light-emitting element LE3, the fourth light-emitting element LE4, the seventh light-emitting element LE7, and the eighth light-emitting element LE8 that are located in one basic unit U and emit light of the same second color may be commonly driven by one pixel circuit (e.g., the second pixel circuit PC2). Accordingly, the light-emitting elements LE that are located in one basic unit U and emit light of the same color may be commonly driven by one pixel circuit PC. That is, the first light-emitting element LE1 and the second light-emitting element LE2 that emit light of a first color may be commonly driven by one pixel circuit, the third light-emitting element LE3, the fourth light-emitting element LE4, the seventh light-emitting element LE7, and the eighth light-emitting element LE8 that emit light of the same second color may be commonly driven by one pixel circuit, and the fifth light-emitting element LE5 and the sixth light-emitting element LE6 may be commonly driven by one pixel circuit.

As a comparative example, when the third light-emitting element LE3, the fourth light-emitting element LE4, the seventh light-emitting element LE7, and the eighth light-emitting element LE8 that are located in one basic unit U are driven by different pixel circuits, defects in which color fringes are visible in an image provided by the display apparatus may occur. However, according to an embodiment, because the third light-emitting element LE3, the fourth light-emitting element LE4, the seventh light-emitting element LE7, and the eighth light-emitting element LE8 are driven by one pixel circuit (e.g., the second pixel circuit PC2), color fringes may be minimized.

In some embodiments, when the third light-emitting element LE3, the fourth light-emitting element LE4, the seventh light-emitting element LE7, and the eighth light-emitting element LE8 are driven by two pixel circuits PC and the two pixel circuits PC are configured to receive the same data signal, color fringes may be minimized.

Figure 8:
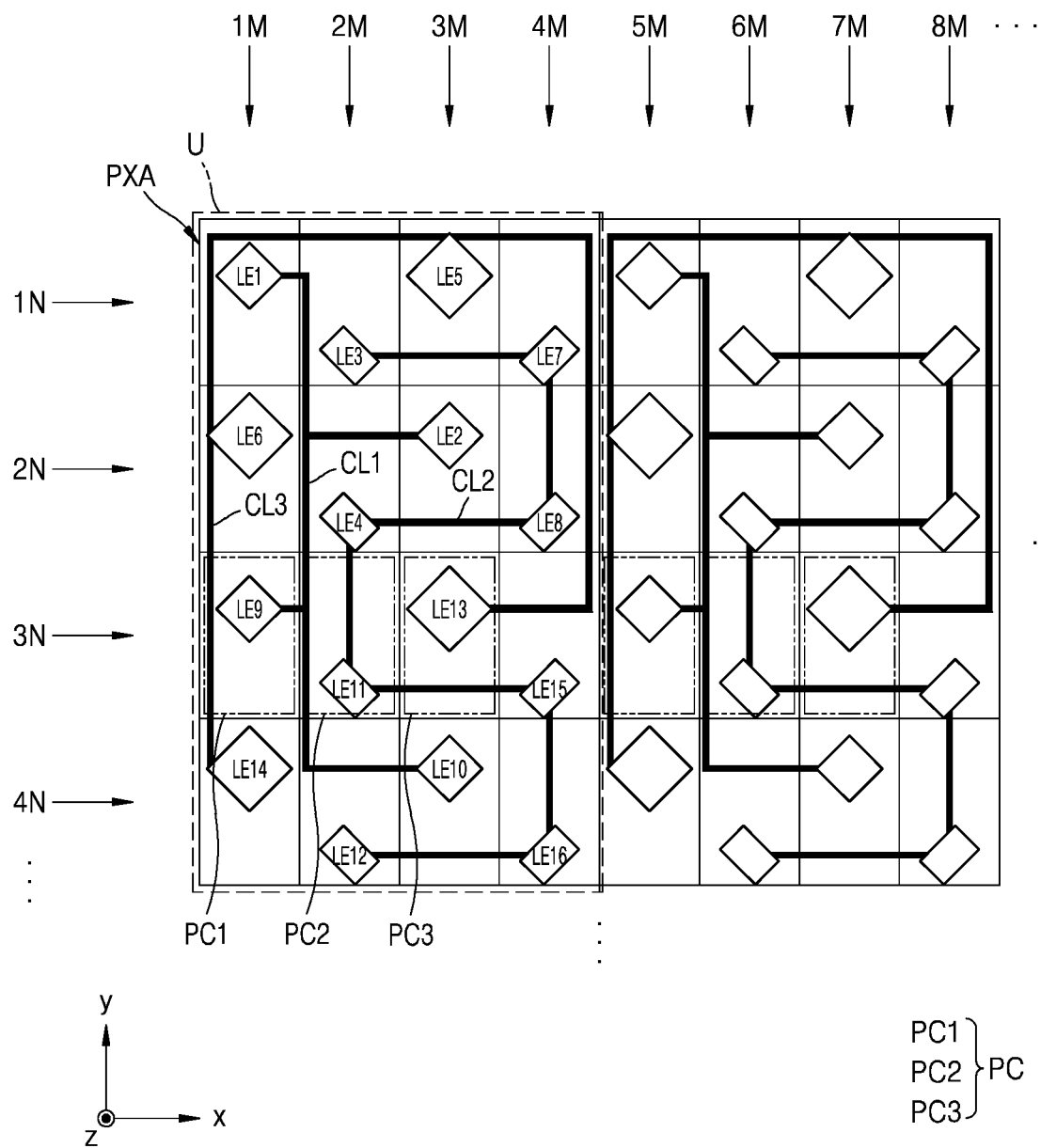
FIG. 8 is a plan view illustrating an arrangement of some elements of a display apparatus, according to another embodiment.

FIG. 8 is a plan view illustrating an arrangement of some elements of a display apparatus, according to another embodiment. A description of the same or corresponding elements as those described with reference to FIG. 6 will be omitted for ease in explanation of this figure, and the following will focus on a difference.

Referring to FIG. 8, a second pixel circuit PC2 may commonly drive not only the third light-emitting element LE3, the fourth light-emitting element LE4, the seventh light-emitting element LE7, and the eighth light-emitting element LE8 but also the 11$^{th}$ light-emitting element LE11, the 12$^{th}$ light-emitting element LE12, the 15$^{th}$ light-emitting element LE15, and the 16$^{th}$ light-emitting element LE16. Accordingly, the basic unit U may include three pixel circuits, for example, first through third pixel circuits PC1, PC2, and PC3.

The third light-emitting element LE3, the fourth light-emitting element LE4, the seventh light-emitting element LE7, the eighth light-emitting element LE8, the 11$^{th}$ light-emitting element LE11, the 12$^{th}$ light-emitting element LE12, the 15$^{th}$ light-emitting element LE15, and the 16$^{th}$ light-emitting element LE16 may be electrically connected to one another by a second conductive layer CL2, and to this end, the second conductive layer CL2 may extend from the third light-emitting element LE3 to each of the fourth light-emitting element LE4, the seventh light-emitting element LE7, the eighth light-emitting element LE8, the 11$^{th}$ light-emitting element LE11, the 12$^{th}$ light-emitting element LE12, the 15$^{th}$ light-emitting element LE15, and the 16$^{th}$ light-emitting element LE16 in a plan view.

As such, all of eight light-emitting elements LE3, LE4, LE7, LE8, LE11, LE12, LE15, and LE16 that are located in one basic unit U and emit light of the same second color may be commonly driven by one pixel circuit (e.g., the second pixel circuit PC2). Accordingly, the light-emitting elements LE that are located in one basic unit U and emit light of the same color may be commonly driven by one pixel circuit PC. That is, the first light-emitting element LE1, the second light-emitting element LE2, the ninth light-emitting element LE9, and the tenth light-emitting element LE10 that emit light of a first color may be commonly driven by one pixel circuit PC, eight light-emitting elements LE3, LE4, LE7, LE8, LE11, LE12, LE15, and LE16 that emit light of the same second color may be commonly driven by one pixel circuit, and the fifth light-emitting element LE5, the sixth light-emitting element LE6, the 13$^{th}$ light-emitting element LE13, and the 14$^{th}$ light-emitting element LE14 that emit light of a third color may be commonly driven by one pixel circuit. Accordingly, color fringes may be minimized.

Figure 9A:
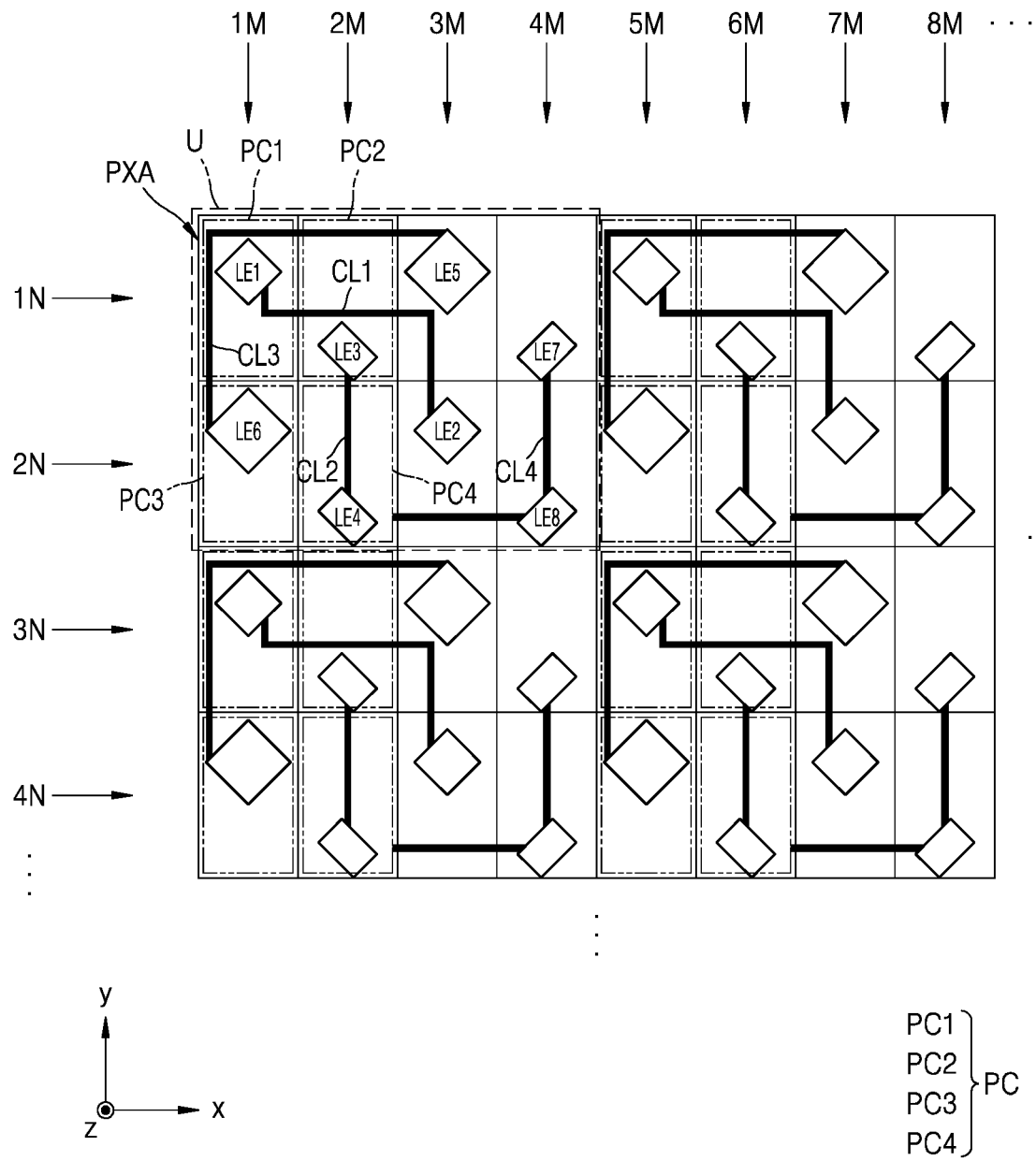
FIGS. 9A and 9B are plan views illustrating an arrangement of some elements of a display apparatus, according to another embodiment.
Figure 9B:
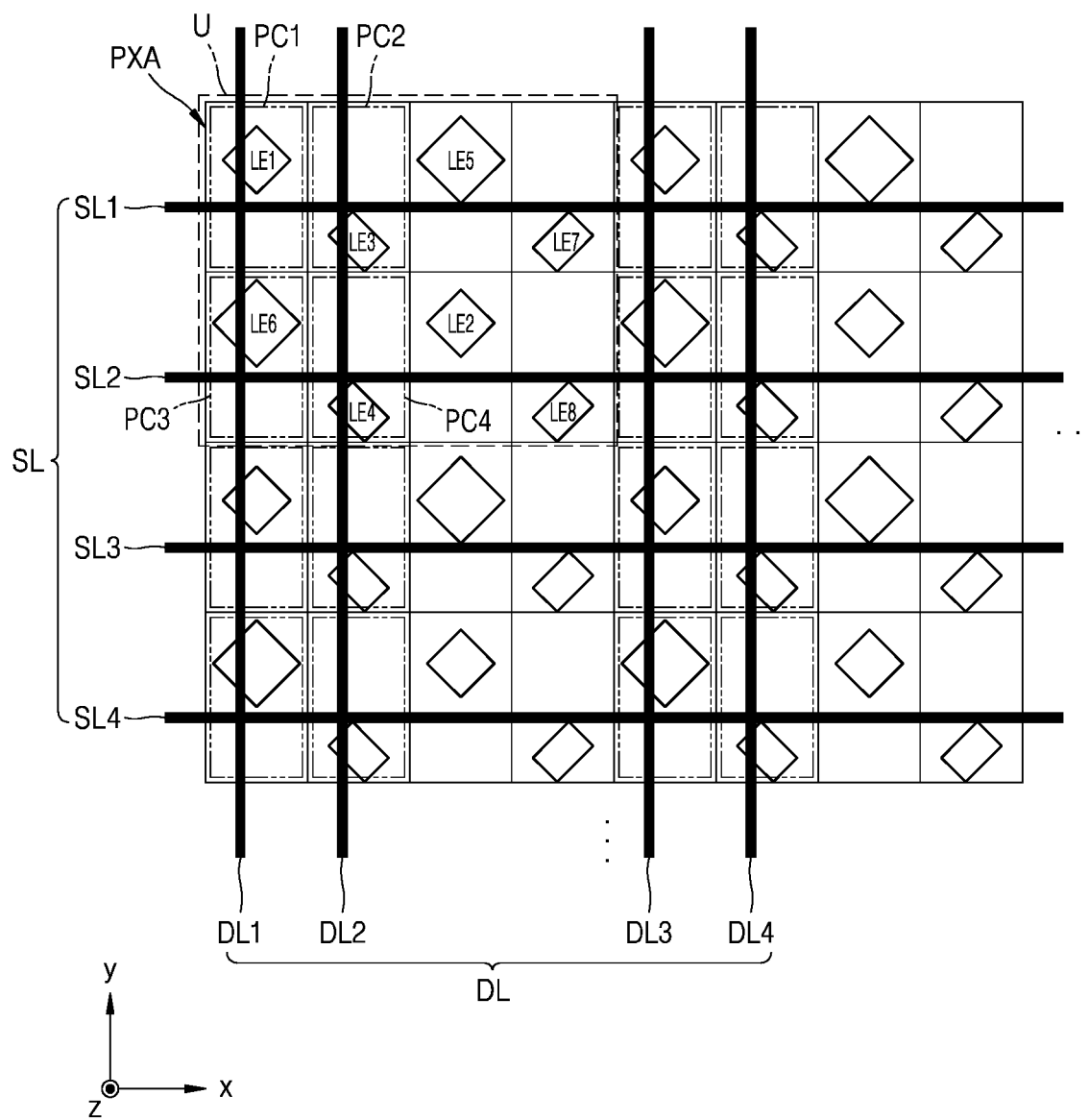

FIGS. 9A and 9B are plan views illustrating an arrangement of some elements of a display apparatus, according to another embodiment. A description of the same or corresponding elements as those described with reference to FIGS. 5A and 5B will be omitted for ease in explanation of these figures, and the following will focus on a difference.

Referring to FIG. 9A, four pixel circuits, for example, first through fourth pixel circuits PC1, PC2, PC3, and PC4, of the basic unit U may be arranged in two rows and two columns. For example, the first pixel circuit PC1 and the second pixel circuit PC2 may be arranged in a first row 1N, and the third pixel circuit PC3 and the fourth pixel circuit PC4 may be arranged in a second row 2N. The first pixel circuit PC1 and the third pixel circuit PC3 may be arranged in a first column 1M, and the second pixel circuit PC2 and the fourth pixel circuit PC4 may be arranged in a second column 2M. One pixel circuit PC does not necessarily correspond to one pixel area PXA, and one pixel circuit PC may be located to correspond to two pixel areas PXA or may be located to correspond to a portion of the pixel area PXA. However, even in this case, four pixel circuits, for example, the first through fourth pixel circuits PC1, PC2, PC3, and PC4, may be arranged in two rows and two columns.

Referring to FIG. 9B, four pixel circuits, for example, the first through fourth pixel circuits PC1, PC2, PC3, and PC4, of the basic unit U may receive an electrical signal through two scan lines SL and two data lines DL. For example, the first pixel circuit PC1 and the second pixel circuit PC2 arranged in a first row 1N may be commonly electrically connected to a first scan line SL1, and the third pixel circuit PC3 and the fourth pixel circuit PC4 arranged in a second row 2N may be commonly electrically connected to a second scan line SL2. Also, for example, the first pixel circuit PC1 and the third pixel circuit PC3 arranged in a first column 1M may be commonly electrically connected to a first data line DL1, and the second pixel circuit PC2 and the fourth pixel circuit PC4 arranged in a second column 2M may be commonly electrically connected to a second data line DL2.

This arrangement may be repeated in the row direction (e.g., the x direction) and the column direction (e.g., the y direction). That is, as described above, the basic unit U may be arranged in the row direction and the column direction, and a third scan line SL3 or a fourth scan line SL4 spaced apart in the column direction from the second scan line SL2 may be electrically connected to the pixel circuits PC of the basic units U arranged in the row direction. Likewise, a third data line DL3 or a fourth data line DL4 spaced apart in the row direction from the second data line DL2 may be electrically connected to the pixel circuits PC of the basic units U arranged in the column direction.

Through this arrangement, the number of used data lines DL may be minimized. For example, as shown in FIG. 9B, in order to drive the light-emitting elements LE arranged in four columns, only two data lines DL may be used. Accordingly, the display apparatus having a high resolution may be provided and the number of used data lines DL may be minimized.

Figure 10:
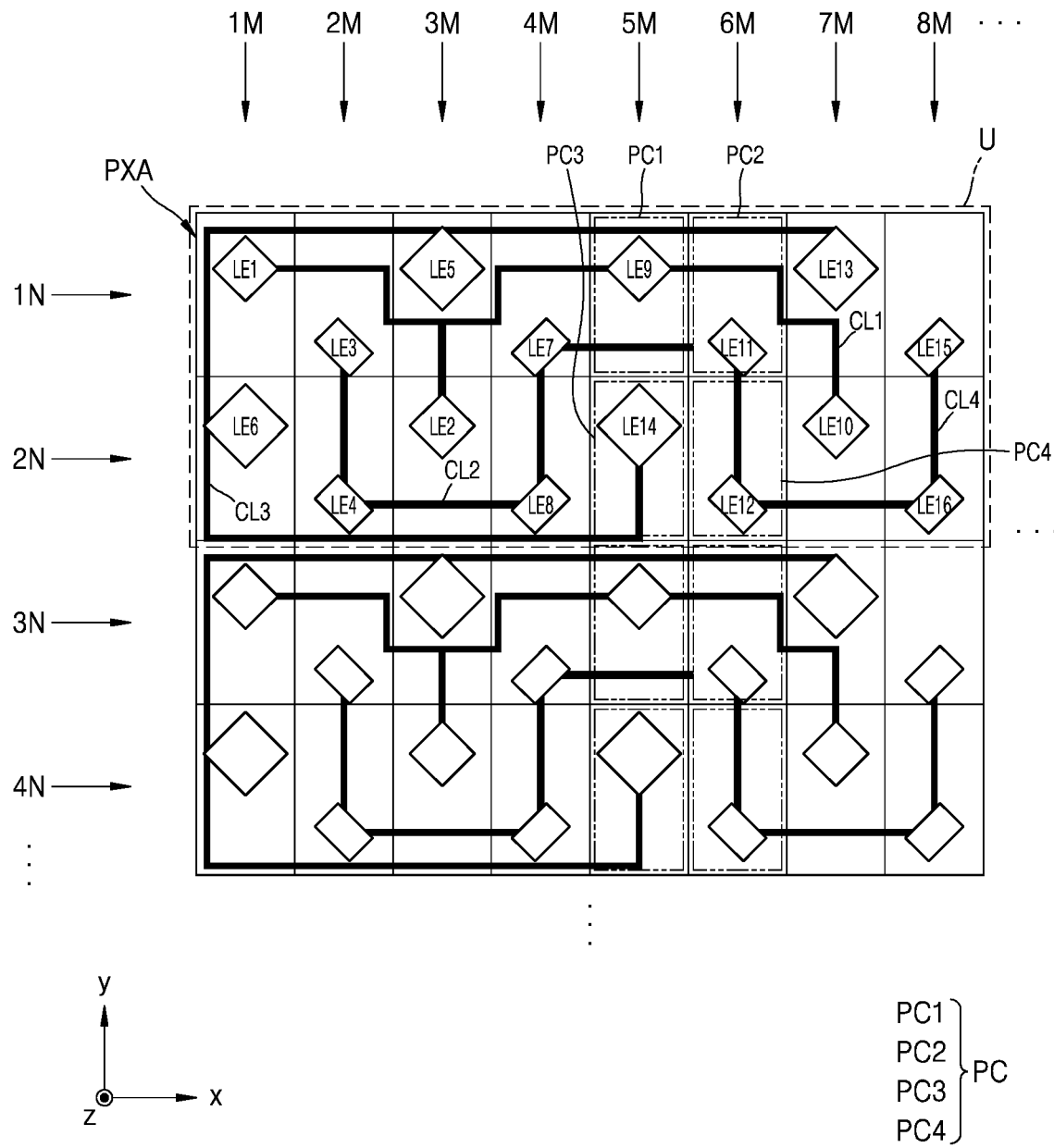
FIG. 10 is a plan view illustrating an arrangement of some elements of a display apparatus, according to another embodiment.

FIG. 10 is a plan view illustrating an arrangement of some elements of a display apparatus, according to another embodiment. A description of the same or corresponding elements as those described with reference to FIG. 9A will be omitted for ease in explanation of this figure, and the following will focus on a difference.

Referring to FIG. 10, 16 pixel areas PXA may constitute one basic unit U. In this case, the basic unit U may be a set of pixel areas PXA arranged in two rows and eight columns, and may include elements located in the 16 pixel areas PXA. For example, the basic unit U may include 16 light-emitting elements, for example, first through 16$^{th}$ light-emitting elements LE1 through LE16. In FIG. 10, two basic units U are illustrated. Hereinafter, one basic unit U will be described.

According to an embodiment, a first pixel circuit PC1 may commonly drive not only the first light-emitting element LE1 and the second light-emitting element LE2 but also the ninth light-emitting element LE9 and the tenth light-emitting element LE10. That is, the first light-emitting element LE1, the second light-emitting element LE2, the ninth light-emitting element LE9, and the tenth light-emitting element LE10 may be commonly driven (or controlled) by one pixel circuit, for example, the first pixel circuit PC1.

For example, the first light-emitting element LE1 and the second light-emitting element LE2 may be arranged in different rows, and the ninth light-emitting element LE9 and the tenth light-emitting element LE10 may be arranged in different columns. For example, the first light-emitting element LE1 and the ninth light-emitting element LE9 may be arranged in a first row 1N, and the second light-emitting element LE2 and the tenth light-emitting element LE10 may be arranged in a second row 2N. For example, the first light-emitting element LE1, the second light-emitting element LE2, the ninth light-emitting element LE9, and the tenth light-emitting element LE10 may be arranged in different columns. For example, the first light-emitting element LE1 may be arranged in a first column 1M, the second light-emitting element LE2 may be arranged in a third column 3M, the ninth light-emitting element LE9 may be arranged in a fifth column 5M, and the tenth light-emitting element LE10 may be arranged in a seventh column 7M.

In an embodiment, a plurality of light-emitting elements LE commonly driven by one pixel circuit PC may be electrically connected to one another. For example, the first light-emitting element LE1, the second light-emitting element LE2, the ninth light-emitting element LE9, and the tenth light-emitting element LE10 may be electrically connected to one another. To this end, in some embodiments, a first conductive layer CL1 for electrically connecting the first light-emitting element LE1, the second light-emitting element LE2, the ninth light-emitting element LE9, and the tenth light-emitting element LE10 may be provided. The first conductive layer CL1 may also be electrically connected to the first pixel circuit PC1. The first conductive layer CL1 may extend from the first light-emitting element LE1 to each of the second light-emitting element LE2, the ninth light-emitting element LE9, and the tenth light-emitting element LE10 in a plan view. In another embodiment, pixel electrodes of the first light-emitting element LE1, the second light-emitting element LE2, the ninth light-emitting element LE9, and the tenth light-emitting element LE10 may be integrally formed with one another, so that the first light-emitting element LE1, the second light-emitting element LE2, the ninth light-emitting element LE9, and the tenth light-emitting element LE10 are electrically connected to one another.

According to an embodiment, a second pixel circuit PC2 may commonly drive not only the third light-emitting element LE3 and the fourth light-emitting element LE4 but also the seventh light-emitting element LE7 and the eighth light-emitting element LE8. That is, the third light-emitting element LE3, the fourth light-emitting element LE4, the seventh light-emitting element LE7, and the eighth light-emitting element LE8 may be commonly driven (or controlled) by one pixel circuit, for example, the second pixel circuit PC2.

For example, the third light-emitting element LE3 and the fourth light-emitting element LE4 may be arranged in different rows, and the seventh light-emitting element LE7 and the eighth light-emitting element LE8 may be arranged in different rows. For example, the third light-emitting element LE3 and the seventh light-emitting element LE7 may be arranged in the first row 1N, and the fourth light-emitting element LE4 and the eighth light-emitting element LE8 may be arranged in the second row 2N. For example, the third light-emitting element LE3 and the seventh light-emitting element LE7 may be arranged in different columns, and the fourth light-emitting element LE4 and the eighth light-emitting element LE8 may be arranged in different columns. For example, the third light-emitting element LE3 and the fourth light-emitting element LE4 may be arranged in a second column 2M, and the seventh light-emitting element LE7 and the eighth light-emitting element LE8 may be arranged in a fourth column 4M.

In an embodiment, a plurality of light-emitting elements LE commonly driven by one pixel circuit PC may be electrically connected to one another. For example, the third light-emitting element LE3, the fourth light-emitting element LE4, the seventh light-emitting element LE7, and the eighth light-emitting element LE8 may be electrically connected to one another. To this end, in some embodiments, a second conductive layer CL2 for electrically connecting the third light-emitting element LE3, the fourth light-emitting element LE4, the seventh light-emitting element LE7, and the eighth light-emitting element LE8 may be provided. The second conductive layer CL2 may extend from the third light-emitting element LE3 to each of the fourth light-emitting element LE4, the seventh light-emitting element LE7, and the eight light-emitting element LE8 in a plan view. The second conductive layer CL2 may also be electrically connected to the second pixel circuit PC2. The second conductive layer CL2 may extend from any one of the third light-emitting element LE3, the fourth light-emitting element LE4, the seventh light-emitting element LE7, and the eighth light-emitting element LE8 to the second pixel circuit PC2 in a plan view. In another embodiment, pixel electrodes of the first light-emitting element LE1, the second light-emitting element LE2, the ninth light-emitting element LE9, and the tenth light-emitting element LE10 may be integrally formed with one another, so that the first light-emitting element LE1, the second light-emitting element LE2, the ninth light-emitting element LE9, and the tenth light-emitting element LE10 are electrically connected to one another.

According to an embodiment, a third pixel circuit PC3 may commonly drive not only the fifth light-emitting element LE5 and the sixth light-emitting element LE6 but also the $13^{th}$ light-emitting element LE13 and the $14^{th}$ light-emitting element LE14. That is, the fifth light-emitting element LE5, the sixth light-emitting element LE6, the $13^{th}$ light-emitting element LE13, and the $14^{th}$ light-emitting element LE14 may be commonly driven (or controlled) by one pixel circuit, for example, the third pixel circuit PC3.

For example, the fifth light-emitting element LE5 and the sixth light-emitting element LE6 may be arranged in different rows, and the $13^{th}$ light-emitting element LE13 and the $14^{th}$ light-emitting element LE14 may be arranged in different rows. For example, the fifth light-emitting element LE5 and the $13^{th}$ light-emitting element LE13 may be arranged in the first row 1N, and the sixth light-emitting element LE6 and the $14^{th}$ light-emitting element LE14 may be arranged in the second row 2N. For example, the fifth light-emitting element LE5, the sixth light-emitting element LE6, the $13^{th}$ light-emitting element LE13, and the $14^{th}$ light-emitting element LE14 may be arranged in different columns, For example, the fifth light-emitting element LE5 may be arranged in the third column 3M, the sixth light-emitting element LE6 may be arranged in the first column 1M, the $13^{th}$ light-emitting element LE13 may be arranged in the seventh column 7M, and the $14^{th}$ light-emitting element LE14 may be arranged in the fifth column 5M.

In an embodiment, a plurality of light-emitting elements LE commonly driven by one pixel circuit PC may be electrically connected to one another. For example, the fifth light-emitting element LE5, the sixth light-emitting element LE6, the $13^{th}$ light-emitting element LE13, and the $14^{th}$ light-emitting element LE14 may be electrically connected to one another. To this end, in some embodiments, a third conductive layer CL3 for electrically connecting the fifth light-emitting element LE5, the sixth light-emitting element LE6, the $13^{th}$ light-emitting element LE13, and the $14^{th}$ light-emitting element LE14 may be provided. The third conductive layer CL3 may also be electrically connected to the third pixel circuit PC3. The third conductive layer CL3 may extend from the fifth light-emitting element LE5 to each of the sixth light-emitting element LE6, the $13^{th}$ light-emitting element LE13, and the $14^{th}$ light-emitting element LE14 in a plan view. In another embodiment, pixel electrodes of the fifth light-emitting element LE5, the sixth light-emitting element LE6, the $13^{th}$ light-emitting element LE13, and the $14^{th}$ light-emitting element LE14 may be integrally formed with one another, so that the fifth light-emitting element LE5, the sixth light-emitting element LE6, the $13^{th}$ light-emitting element LE13, and the $14^{th}$ light-emitting element LE14 are electrically connected to one another.

According to an embodiment, a fourth pixel circuit PC4 may commonly drive the $11^{th}$ light-emitting element LE11, the $12^{th}$ light-emitting element LE12, the $15^{th}$ light-emitting element LE15, and the $16^{th}$ light-emitting element LE16. That is, the $11^{th}$ light-emitting element LE11, the $12^{th}$ light-emitting element LE12, the $15^{th}$ light-emitting element LE15, and the $16^{th}$ light-emitting element LE16 may be commonly driven (or controlled) by one pixel circuit, for example, the fourth pixel circuit PC4.

For example, the $11^{th}$ light-emitting element LE11 and the $12^{th}$ light-emitting element LE12 may be arranged in different rows, and the $15^{th}$ light-emitting element LE15 and the $16^{th}$ light-emitting element LE16 may be arranged in different rows. For example, the $11^{th}$ light-emitting element LE11 and the $15^{th}$ light-emitting element LE15 may be arranged in the first row 1N, and the $12^{th}$ light-emitting element LE12 and the $16^{th}$ light-emitting element LE16 may be arranged in the second row 2N. For example, the $11^{th}$ light-emitting element LE11 and the $15^{th}$ light-emitting element LE15 may be arranged in different columns, and the $12^{th}$ light-emitting element LE12 and the $16^{th}$ light-emitting element LE16 may be arranged in different columns. For example, the $11^{th}$ light-emitting element LE11 and the $12^{th}$ light-emitting element LE12 may be arranged in a sixth column 6M, and the $15^{th}$ light-emitting element LE15 and the $16^{th}$ light-emitting element LE16 may be arranged in an eighth column 8M.

In an embodiment, a plurality of light-emitting elements LE commonly driven by one pixel circuit PC may be electrically connected to one another. For example, the 11$^{th}$ light-emitting element LE11, the 12$^{th}$ light-emitting element LE12, the 15$^{th}$ light-emitting element LE15, and the 16$^{th}$ light-emitting element LE16 may be electrically connected to one another. To this end, in some embodiments, a fourth conductive layer CL4 for electrically connecting the 11$^{th}$ light-emitting element LE11, the 12$^{th}$ light-emitting element LE12, the 15$^{th}$ light-emitting element LE15, and the 16$^{th}$ light-emitting element LE16 may be provided. The fourth conductive layer CL4 may also be electrically connected to the fourth pixel circuit PC4. The fourth conductive layer CL4 may extend from the 11$^{th}$ light-emitting element LE11 to each of the 12$^{th}$ light-emitting element LE12, the 15$^{th}$ light-emitting element LE15, and the 16$^{th}$ light-emitting element LE16 in a plan view. In another embodiment, pixel electrodes of the 11$^{th}$ light-emitting element LE11, the 12$^{th}$ light-emitting element LE12, the 15$^{th}$ light-emitting element LE15, and the 16$^{th}$ light-emitting element LE16 may be integrally formed with one another, so that the 11$^{th}$ light-emitting element LE11, the 12$^{th}$ light-emitting element LE12, the 15$^{th}$ light-emitting element LE15, and the 16$^{th}$ light-emitting element LE16 are electrically connected to one another.

According to an embodiment, the first light-emitting element LE1, the second light-emitting element LE2, the ninth light-emitting element LE9, and the tenth light-emitting element LE10 may emit light of the same first color. The third light-emitting element LE3, the fourth light-emitting element LE4, the seventh light-emitting element LE7, and the eighth light-emitting element LE8 may emit light of the same second color, and the second color may be different from the first color. The fifth light-emitting element LE5, the sixth light-emitting element LE6, the 13$^{th}$ light-emitting element LE13, and the 14$^{th}$ light-emitting element LE14 may emit light of the same third color, and the third color may be different from the first color and the second color. For example, the 11$^{th}$ light-emitting element LE11, the 12$^{th}$ light-emitting element LE12, the 15$^{th}$ light-emitting element LE15, and the 16$^{th}$ light-emitting element LE16 may emit light of the same second color. Each of the first through third colors may be any one of red, green, and blue, or any one of red, green, blue, and white. For example, the first color may be red, the second color may be green, and the third color may be blue.

As such, 16 light-emitting elements, for example, the first through 16$^{th}$ light-emitting elements LE1 through LE16, may be driven by using four pixel circuits, for example, the first through fourth pixel circuits PC1, PC2, PC3, and PC4. That is, the display apparatus 1 may include the pixel circuits PC whose number is less than the number of the light-emitting elements LE. Also, through this arrangement, the number of used data lines (not shown) may be minimized. Because four pixel circuits, for example, the first through fourth pixel circuits PC1, PC2, PC3, and PC4, are arranged in two columns, only two data lines DL may be used to drive 16 light-emitting elements LE arranged in eight columns. Accordingly, the display apparatus having a high resolution may be provided and the number of used data lines DL may be minimized.

Figure 11:
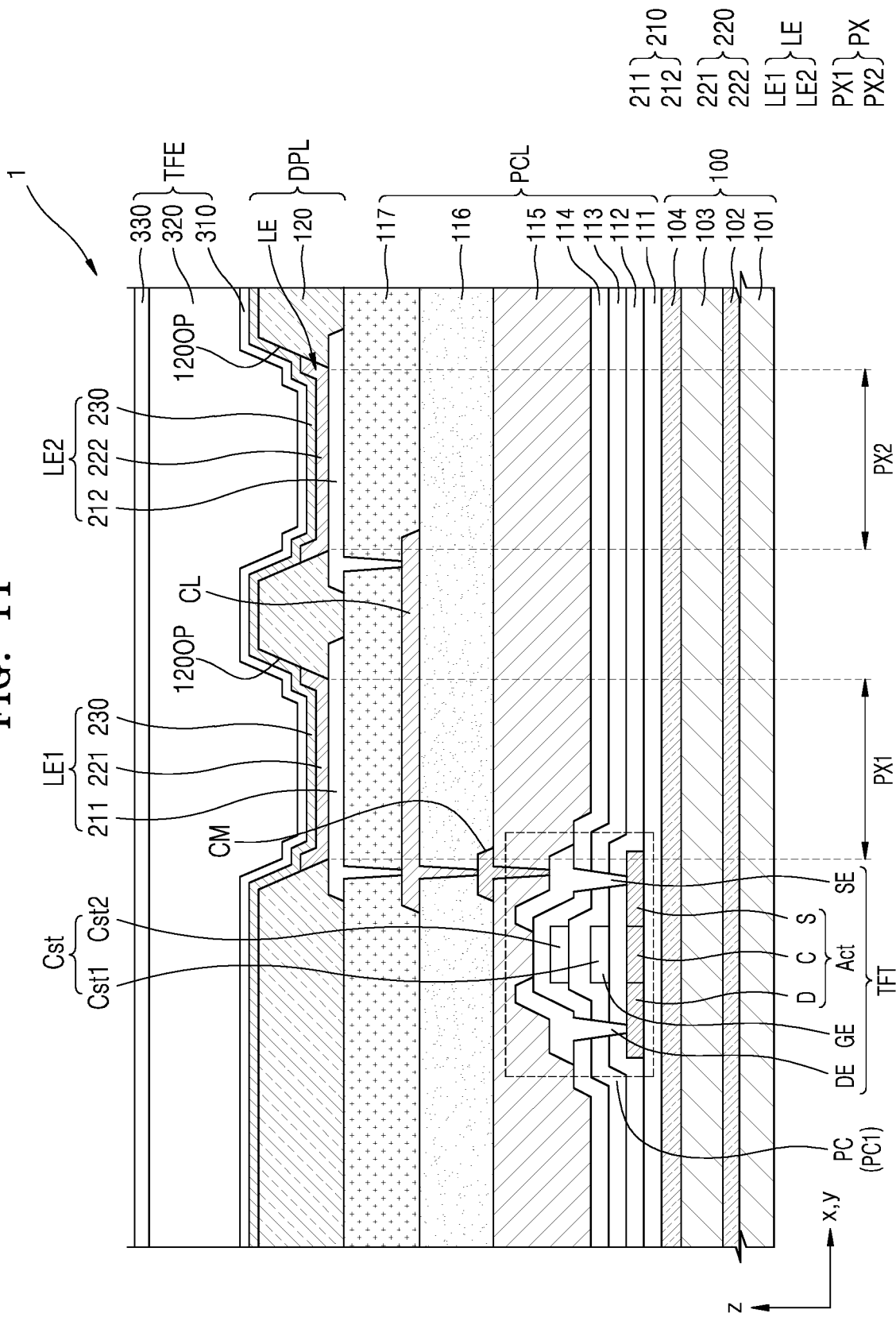
FIG. 11 is a cross-sectional view illustrating a part of a display apparatus, according to an embodiment.

FIG. 11 is a cross-sectional view illustrating a part of a display apparatus, according to an embodiment.

Referring to FIG. 11, the display apparatus 1 may include a stacked structure including the substrate 100, a pixel circuit layer PCL, a display layer DPL, and a thin-film encapsulation layer TFE.

The substrate 100 may have a multi-layer structure including a base layer including a polymer resin and an inorganic layer. For example, the substrate 100 may include a base layer including a polymer resin and a barrier layer of an inorganic insulating layer. For example, the substrate 100 may include a first base layer 101, a first barrier layer 102, a second base layer 103, and a second barrier layer 104 that are sequentially stacked. Each of the first base layer 101 and the second base layer 103 may include polyimide (PI), polyethersulfone (PES), polyarylate, polyetherimide (PEI), polyethylene naphthalate (PEN), polyethylene terephthalate (PET), polyphenylene sulfide (PPS), polycarbonate (PC), cellulose triacetate (TAC), or cellulose acetate propionate (CAP). Each of the first barrier layer 102 and the second barrier layer 104 may include an inorganic insulating material such as silicon oxide, silicon oxynitride, or silicon nitride. The substrate 100 may be flexible.

The pixel circuit layer PCL is located on the substrate 100. The pixel circuit layer PCL may include a plurality of pixel circuits PC located on the substrate 100 and including a thin-film transistor TFT and a storage capacitor Cst. FIG. 11 is a cross-sectional view illustrating the first pixel circuit PC1, according to an embodiment. Also, the pixel circuit layer PCL may include a buffer layer 111, a first gate insulating layer 112, a second gate insulating layer 113, an interlayer insulating layer 114, a first organic insulating layer 115, a second organic insulating layer 116, and a third organic insulating layer 117 which are located under and/or over elements of the pixel circuit PC.

The buffer layer 111 may reduce or block penetration of a foreign material, moisture, or external air from the bottom of the substrate 100, and may planarize the substrate 100. The buffer layer 111 may include an inorganic insulating material such as silicon oxide, silicon oxynitride, or silicon nitride, and may have a single or multi-layer structure including the above material.

The thin-film transistor TFT may be located on the buffer layer 111. The thin-film transistor TFT of FIG. 11 may be, for example, the driving thin-film transistor T1 (see FIG. 3) described with reference to FIG. 3. The thin-film transistor TFT may include a semiconductor layer Act, and the semiconductor layer Act may include polysilicon. Alternatively, the semiconductor layer Act may include amorphous silicon, an oxide semiconductor, or an organic semiconductor. The semiconductor layer Act may include a channel region C, and a drain region D and a source region S respectively located on both sides of the channel region C. A gate electrode GE may overlap the channel region C.

The gate electrode GE may include a low-resistance metal material. The gate electrode GE may include a conductive material including molybdenum (Mo), aluminum (Al), copper (Cu), or titanium (Ti), and may have a single or multilayer structure including the above material.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may be provided to cover the gate electrode GE. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), like the first gate insulating layer 112.

An upper electrode Cst2 of the storage capacitor Cst may be located on the second gate insulating layer 113. The upper electrode Cst2 may overlap the gate electrode GE below the upper electrode Cst2. In this case, the gate electrode GE and the upper electrode Cst2 overlapping each other with the second gate insulating layer 113 therebetween may constitute the storage capacitor Cst. That is, the gate electrode GE may function as a lower electrode Cst1 of the storage capacitor Cst.

As such, the storage capacitor Cst and the thin-film transistor TFT may overlap each other. In some embodiments, the storage capacitor Cst may not overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The interlayer insulating layer 114 may cover the upper electrode Cst2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may have a single or multi-layer structure including the above inorganic insulating material.

Each of a drain electrode DE and a source electrode SE may be located on the interlayer insulating layer 114. The drain electrode DE and the source electrode SE may be respectively connected to the drain region D and the source region S through contact holes of insulating layers under the drain electrode DE and the source electrode SE. Each of the drain electrode DE and the source electrode SE may include a material having high conductivity. Each of the drain electrode DE and the source electrode SE may include a conductive material including molybdenum (Mo), aluminum (Al), copper (Cu), or titanium (Ti), and may have a single or multi-layer structure including the above material. In an embodiment, each of the drain electrode DE and the source electrode SE may have a multi-layer structure including Ti/Al/Ti.

The first organic insulating layer 115 may cover the drain electrode DE and the source electrode SE. That is, the first organic insulating layer 115 may cover the plurality of pixel circuits PC. The first organic insulating layer 115 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

A contact metal CM may be located on the first organic insulating layer 115. The contact metal CM may be electrically connected to the thin-film transistor TFT through a contact hole formed in the first organic insulating layer 115. The contact metal CM may include a conductive material including molybdenum (Mo), aluminum (Al), copper (Cu), or titanium (Ti), and may have a single or multi-layer structure including the above material.

The second organic insulating layer 116 may be located on the first organic insulating layer 115, and may cover the contact metal CM. The second organic insulating layer 116 may include the same material as that of the first organic insulating layer 115, and may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

A conductive layer CL may be located on the second organic insulating layer 116. The conductive layer CL may be electrically connected to the contact metal CM through a contact hole formed in the second organic insulating layer 116. The conductive layer CL may be electrically connected to the pixel circuit PC through the contact metal CM. The conductive layer CL may include a conductive material including, for example, molybdenum (Mo), aluminum (Al), copper (Cu), or titanium (Ti), and may have a single or multi-layer structure including the above material.

The third organic insulating layer 117 may be located on the second organic insulating layer 116, and may cover the conductive layer CL. That is, the third organic insulating layer 117 may be located between the conductive layer CL and pixel electrodes 210 of the plurality of light-emitting elements LE. The third organic insulating layer 117 may include the same material as that of the first organic insulating layer 115, and may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The display layer DPL may be located on the pixel circuit layer PCL having the above structure. The display layer DPL may include the plurality of light-emitting elements LE, and the light-emitting elements LE may each be an organic light-emitting diode OLED. Each of the plurality of light-emitting elements LE may have a stacked structure including the pixel electrode 210, an opposite electrode 230 located on the pixel electrode 210, and an intermediate layer 220 located between the pixel electrode 210 and the opposite electrode 230. For example, a first light-emitting element LE1 may have a stacked structure including a first pixel electrode 211, a first intermediate layer 221, and the opposite electrode 230, and a second light-emitting element LE2 may have a stacked structure including a second pixel electrode 212, a second intermediate layer 222, and the opposite electrode 230.

The pixel electrode 210 may be located on the third organic insulating layer 117, and may be electrically connected to the conductive layer CL through a contact hole formed in the third organic insulating layer 117. The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 210 may further include a film formed of ITO, IZO, ZnO, or $In_2O_3$ over/under the reflective film.

A pixel-defining film 120 having an opening 1200P through which a central portion of the pixel electrode 210 is exposed may be located on the pixel electrode 210. The pixel-defining film 120 may include an organic insulating material and/or an inorganic insulating material. The opening 1200P may define an emission area where light is emitted by the organic light-emitting diode OLED. For example, a size/width of the opening 1200P may correspond to a size/width of the emission area. Accordingly, a size and/or a width of the pixel PX may depend on a size and/or a width of the opening 1200P of the pixel-defining film 120.

The intermediate layer 220 may include an emission layer formed to correspond to the pixel electrode 210. The emission layer may include a high molecular weight organic material or a low molecular weight organic material that emits light of a certain color. Alternatively, the emission layer may include an inorganic light-emitting material or quantum dots.

The intermediate layer 220 may include a first functional layer (not shown) and a second functional layer (not shown) respectively located under and over the emission layer. The first functional layer may include, for example, a hole transport layer (HTL), or a hole transport layer and a hole injection layer (HIL). The second functional layer that is an element located over the emission layer may include an electron transport layer (ETL) and/or an electron injection layer (EIL).

The opposite electrode 230 may be located on the pixel electrode 210, and may overlap the pixel electrode 210. The opposite electrode 230 may be formed of a conductive material having a low work function. For example, the opposite electrode 230 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 230 may further include a layer formed of ITO, IZO, ZnO, or $In_2O_3$ on the (semi-)transparent layer including the above material. The opposite electrode 230 may be integrally formed to entirely cover the substrate 100.

The thin-film encapsulation layer TFE may be located on the display layer DPL, and may cover the display layer DPL. The thin-film encapsulation layer TFE may include at least one inorganic encapsulation layer and at least one organic encapsulation layer, and in an embodiment, in FIG. 11, the thin-film encapsulation layer TFE includes a first inorganic encapsulation layer 310, an organic encapsulation layer 320, and a second inorganic encapsulation layer 330 which are sequentially stacked.

Each of the first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and polyethylene. In an embodiment, the organic encapsulation layer 320 may include acrylate. The organic encapsulation layer 320 may be formed by curing a monomer or applying a polymer. The organic encapsulation layer 320 may be transparent.

According to an embodiment, the conductive layer CL may electrically connect the first pixel circuit PC1 to the first light-emitting element LE1 and may electrically connect the first pixel circuit PC1 to the second light-emitting element LE2. For example, the conductive layer CL may be electrically connected to the first pixel circuit PC1 through the contact metal CM, and may be electrically connected to the first pixel electrode 211 of the first light-emitting element LE1 and the second pixel electrode 212 of the second light-emitting element LE2. The conductive layer CL may extend from the first light-emitting element LE1 to the second light-emitting element LE2 in a plan view. Because the conductive layer CL is provided, the first pixel circuit PC1 may drive both the first light-emitting element LE1 and the second light-emitting element LE2.

Figure 12:
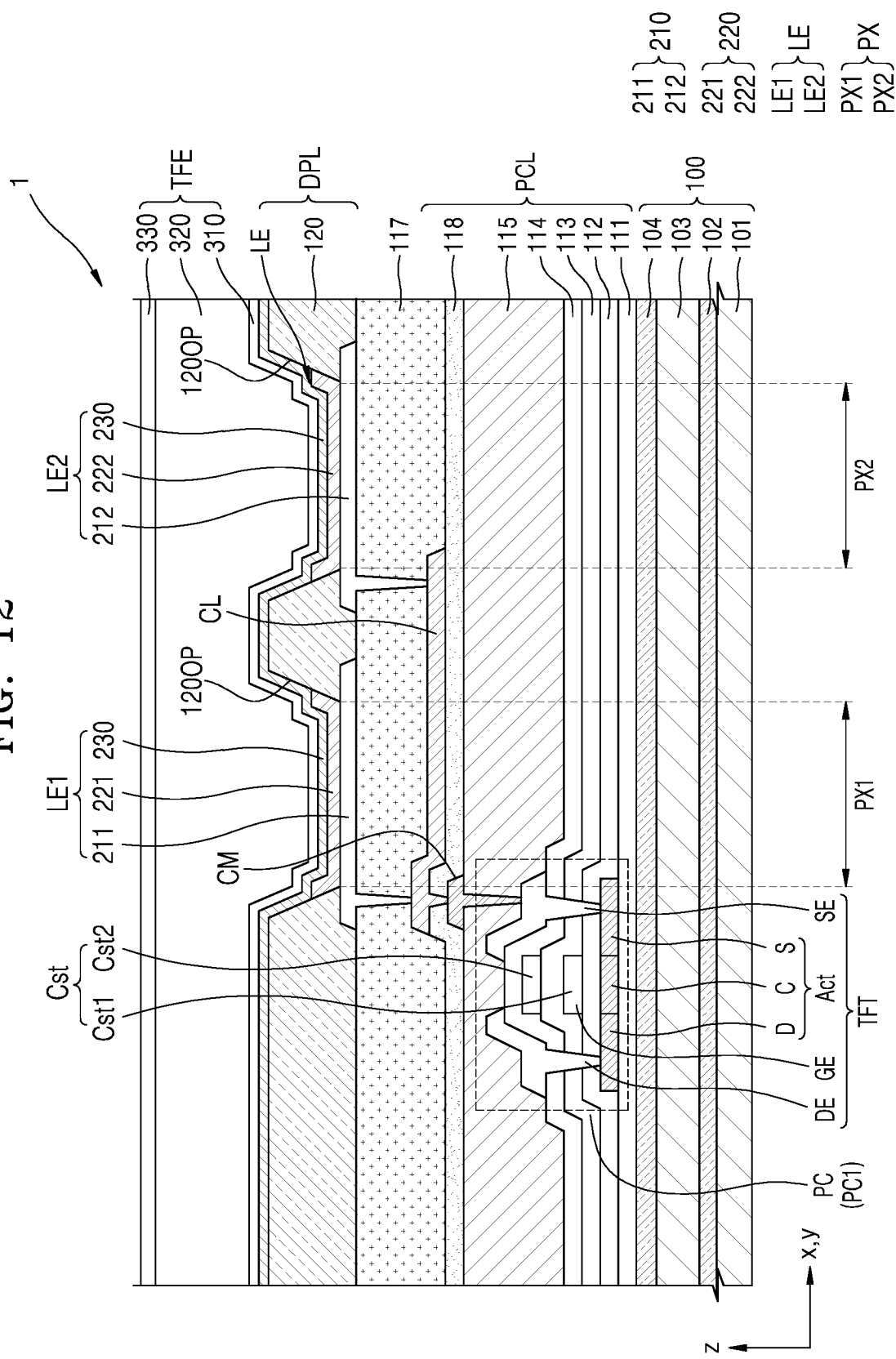
FIG. 12 is a cross-sectional view illustrating a part of a display apparatus, according to another embodiment.

FIG. 12 is a cross-sectional view illustrating a part of a display apparatus, according to another embodiment. A description of the same or corresponding elements as those described with reference to FIG. 11 will be omitted of this figure, and the following will focus on a difference.

Referring to FIG. 12, an inorganic insulating layer 118 may be located between the first organic insulating layer 115 and the third organic insulating layer 117. The inorganic insulating layer 118 may be located on the first organic insulating layer 115, and may cover the contact metal CM. The conductive layer CL may be located on the inorganic insulating layer 118. The conductive layer CL may be connected to the contact metal CM through a contact hole formed in the inorganic insulating layer 118. The inorganic insulating layer 118 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

Figure 13:
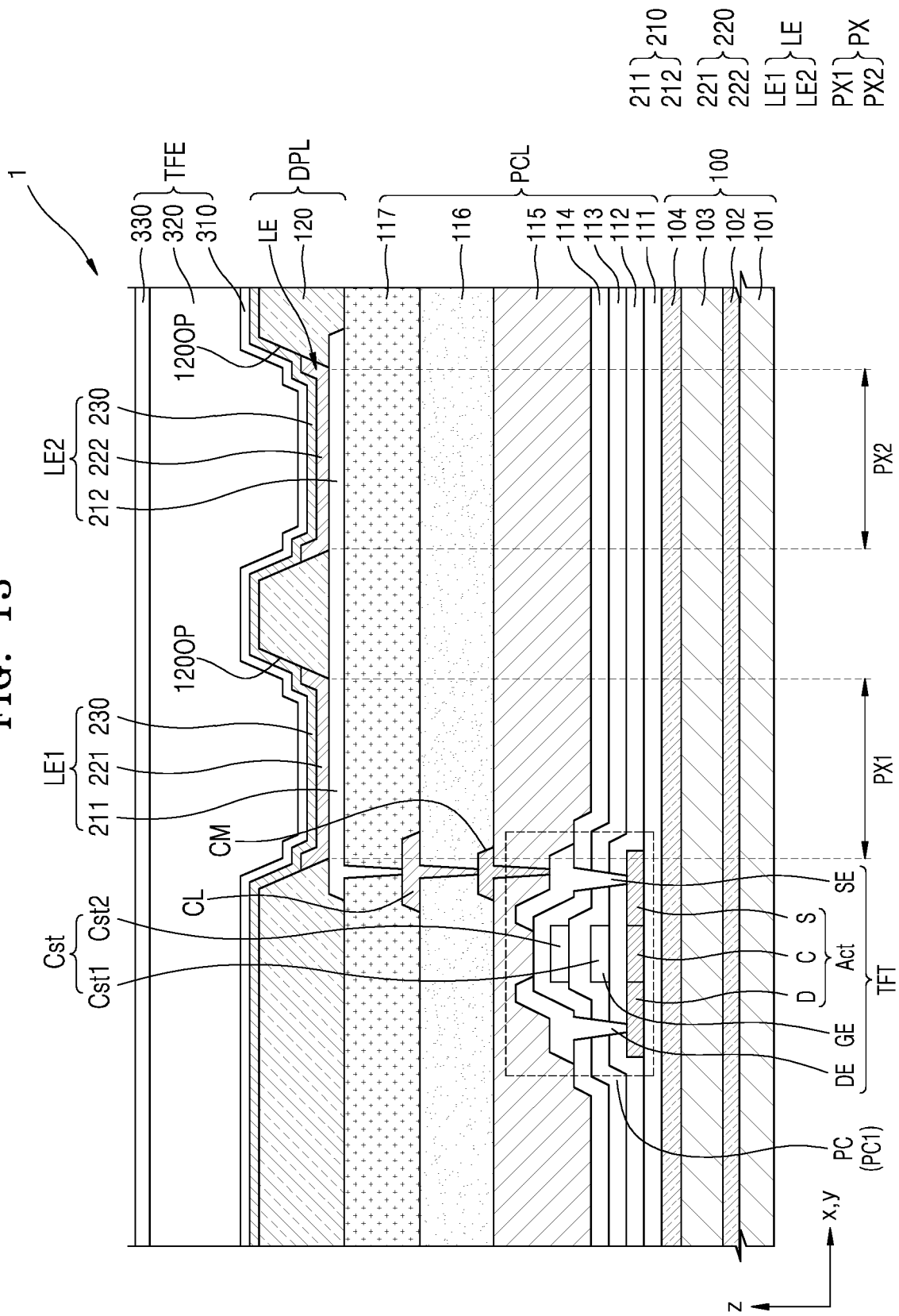
FIG. 13 is a cross-sectional view illustrating a part of a display apparatus, according to another embodiment.

FIG. 13 is a cross-sectional view illustrating a part of a display apparatus, according to another embodiment. A description of the same or corresponding elements as those described with reference to FIG. 11 will be omitted for ease in explanation of this figure, and the following will focus on a difference.

Referring to FIG. 13, the first pixel electrode 211 of the first light-emitting element LE1 and the second pixel electrode 212 of the second light-emitting element LE2 may be integrally formed with each other. The first pixel electrode 211 and the second pixel electrode 212 that are integrally formed with each other may be connected to the conductive layer CL through one contact hole, and the conductive layer CL may be electrically connected to the first pixel circuit PC1 through the contact metal CM. Accordingly, the first light-emitting element LE1 and the second light-emitting element LE2 may be electrically connected to the first pixel circuit PC1.

Figure 14:
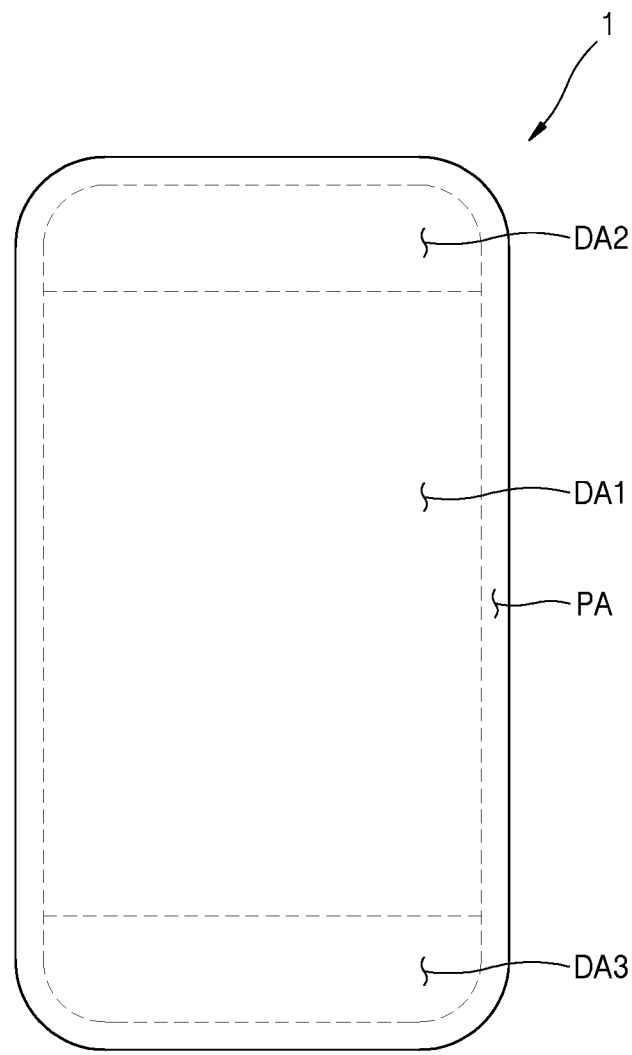
FIG. 14 is a plan view illustrating a display apparatus according to another embodiment.

FIG. 14 is a plan view illustrating a display apparatus according to another embodiment. A description of the same or corresponding elements as those described with reference to FIG. 1 will be omitted for ease in explanation of this figure, and the following will focus on a difference.

Referring to FIG. 14, the display apparatus 1 may include the display area DA and the peripheral area PA outside the display area DA. In an embodiment, the display area DA may include a first display area DA1 and a second display area DA2 adjacent to a side of the first display area DA1. In an alternative embodiment, the display area DA may further include a third display area DA3 adjacent to the other side of the first display area DA1.

In an embodiment, when the display area DA includes all of the first through third display areas DA1, DA2, and DA3, the first through third display areas DA1, DA2, and DA3 may be arranged along a long side of the display apparatus 1 and the first display area DA1 may be located at the center of the display area DA. For example, the first display area DA1 may be located at the center of the display area DA, the second display area DA2 may be adjacent in a y direction to the first display area DA1, and the third display area DA3 may be adjacent in a −y direction to the first display area DA1. However, the embodiment is not limited to the arrangement of the first through third display areas DA1, DA2, and DA3, and the arrangement of the first through third display areas DA1, DA2, and DA3 may be modified in various ways.

In an embodiment, an overall aspect ratio of the display area DA of the display apparatus 1 may be greater than about 1.78. That is, a length of a long side of the display area DA may be about 1.78 times a length of a short side of the display area DA. For example, an aspect ratio of the display area DA may be greater than about 2.38 or about 2.66. The long side of the display area DA may extend in the column direction (e.g., the y direction), and the short side may extend in the row direction (e.g., the x direction).

In an embodiment, an aspect ratio of the first display area DA1 may be a general aspect ratio. For example, an aspect ratio of the first display area DA1 may be about 1.78, and a ratio between a long side and a short side of the first display area DA1 may be about 16:9. However, the embodiment is not limited thereto, and the first display area DA1 may be designed to have any of various aspect ratios.

Figure 15A:
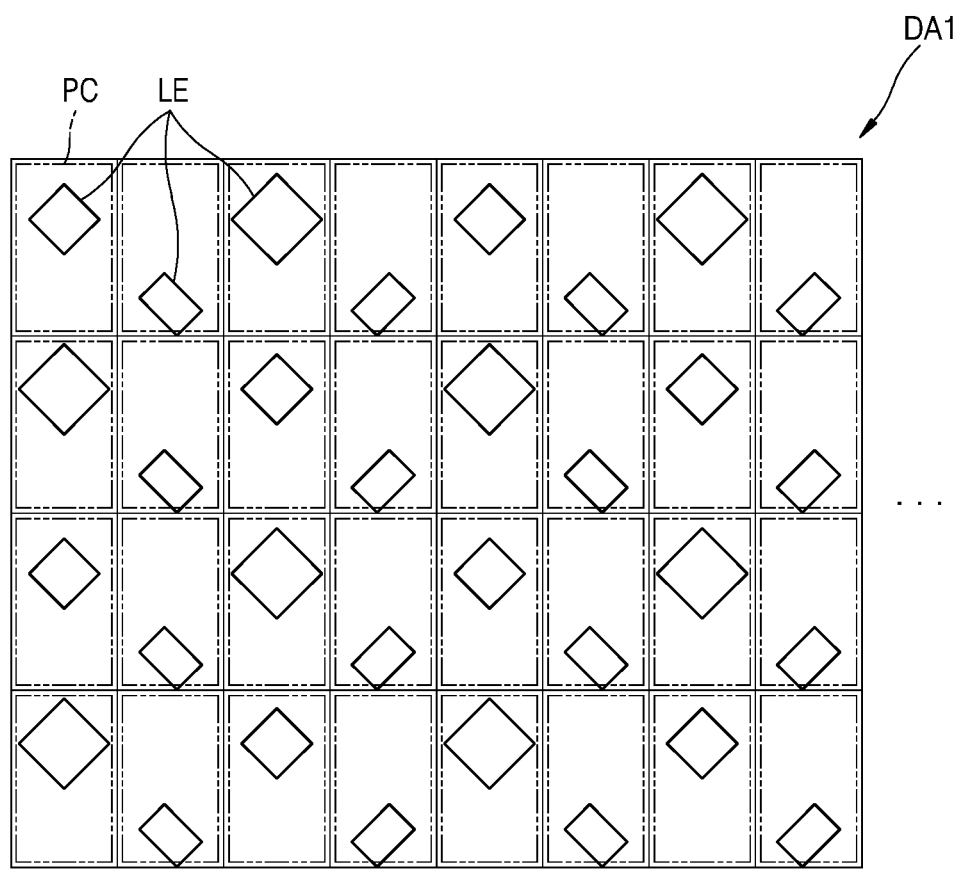
FIGS. 15A and 15B are plan views illustrating an arrangement of some elements of the display apparatus of FIG. 14.
Figure 15B:
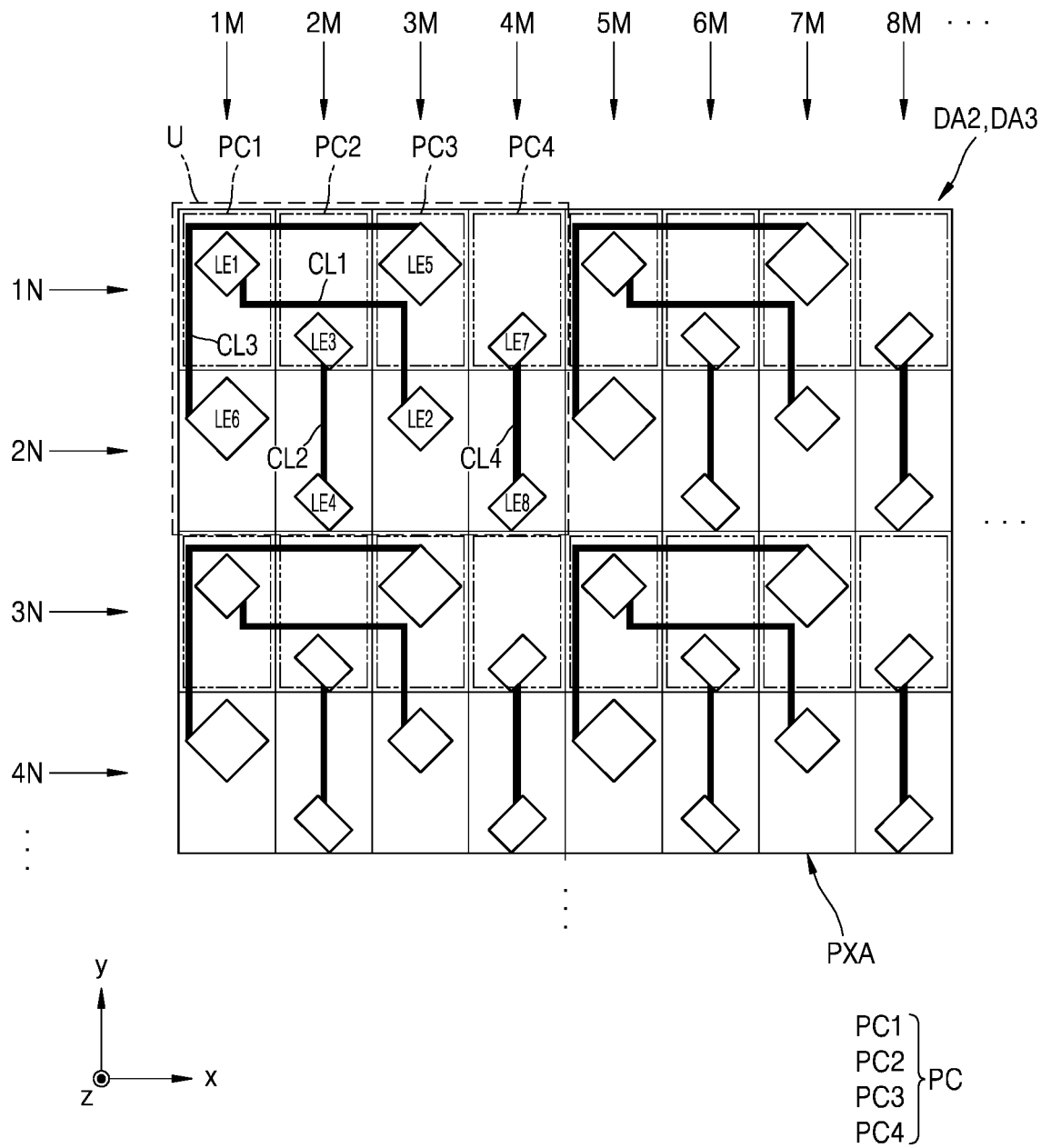

FIGS. 15A and 15B are plan views illustrating an arrangement of some elements of the display apparatus of FIG. 14. FIG. 15A illustrates an arrangement of the pixel circuit PC and the light-emitting element LE located in the first display area DA1 of the display apparatus 1 of FIG. 14. FIG. 15B illustrates an arrangement of the pixel circuit PC and the light-emitting element LE located in the second display area DA2 and/or the third display area DA3 of the display apparatus 1 of FIG. 14.

Referring to FIG. 15A, a ratio between the number of the pixel circuits PC and the number of the light-emitting elements LE located in the first display area DA1 of the display apparatus 1 may be 1:1. That is, the pixel circuits PC as many as the light-emitting elements LE located in the first display area DA1 may be arranged. One pixel circuit PC located in the first display area DA1 may drive one light-emitting element LE.

The first display area DA1 may occupy most of the display area DA of the display apparatus 1, and mots of an image provided to a user may be provided through the first display area DA1. Each light-emitting element LE located in the first display area DA1 may be driven by one pixel circuit PC, thereby providing a high-quality image through the first display area DA1.

Referring to FIG. 15B, an aspect ratio between the number of the pixel circuits PC and the number of the light-emitting elements LE located in the second display area DA2 and/or the third display area DA3 of the display apparatus 1 may not be 1:1. For example, that is, the number of the pixel circuits PC located in the second display area DA2 and/or the third display area DA3 may be less than the number of the light-emitting elements LE. One pixel circuit PC located in the second display area DA2 and/or the third display area DA3 may drive a plurality of light-emitting elements LE.

In an embodiment, in FIG. 15B, the second display area DA2 and/or the third display area DA3 has the same arrangement as that in FIG. 5A. Also, any one of arrangements of the pixel circuit PC and the light-emitting element LE described with reference to FIGS. 6, 7, 8, 9A, and 10 may be applied to the second display area DA2 and/or the third display area DA3 of the display apparatus 1. That is, the first pixel circuit PC1 for commonly driving the first light-emitting element LE1 and the second light-emitting element LE2 may be located only in the second display area DA2 and/or the third display area DA3. When the first pixel circuit PC1 is located only in the display area DA2 and/or the third display area DA3, it denotes that the pixel circuit PC for commonly driving the plurality of light-emitting elements LE is not located in the first display area DA1.

In the display apparatus 1 including the display area DA having a high aspect ratio (see FIG. 14), a portion of the display area DA, that is, the first display area DA1, may include relatively many pixel circuits PC to provide an image having high quality, and another portion of the display area DA, that is, the second display area DA2 and/or the third display area DA, 3 may include the pixel circuits PC for commonly driving the plurality of light-emitting elements LE to minimize the number of the scan lines SL (see FIG. 2). Because the number of the scan lines SL used in the second display area DA2 and/or the third display area DA3 of the display area DA may be minimized, defects such as spots may be prevented from occurring on an image due to a short scan-on time. Alternatively, because the number of the scan lines SL may be minimized, a scan rate of the display apparatus 1 may be increased. Accordingly, the display apparatus 1 with a high resolution and/or a high aspect ratio and capable of providing a high-quality image may be provided.

Although only a display apparatus has been mainly described, the embodiment is not limited thereto. For example, a method of manufacturing the display apparatus may also be within the scope of the embodiment.

According to the one or more embodiments, a display apparatus that may prevent a screen-door effect by maintaining a high resolution and may reduce the number of scan lines and data lines required to drive a high-resolution display apparatus may be provided. However, the embodiment is not limited by such an effect.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
    a substrate;
    a first pixel circuit arranged on the substrate;
    a second pixel circuit arranged on the substrate, and
    a plurality of light-emitting elements arranged in a matrix on the substrate,
    wherein the first pixel circuit is configured to commonly drive a first light-emitting element located in a first row and a second light-emitting element located in a second row different from the first row from among the plurality of light-emitting elements, wherein
    the first light-emitting element is located in a first column,
    the second light-emitting element is located in a second column different from the first column,
    the first light-emitting element and the second light-emitting element emit light of a first color, and
    the second pixel circuit is configured to commonly drive a third light-emitting element and a fourth light-emitting element located in a third column between the first column and the second column from among the plurality of light-emitting elements.

2. The display apparatus of claim 1, wherein the third light-emitting element and the fourth light-emitting element emit light of a second color different from the first color.

3. The display apparatus of claim 2, further comprising a third pixel circuit arranged on the substrate,
    wherein the third pixel circuit is configured to commonly drive a fifth light-emitting element located in the first row and the second column and a sixth light-emitting element located in the second row and the first column from among the plurality of light-emitting elements,
wherein the fifth light-emitting element and the sixth light-emitting element emit light of a third color different from the first color and the second color.

4. The display apparatus of claim 3, further comprising a scan line extending in a row direction and commonly connected to the first through third pixel circuits.

5. The display apparatus of claim 3, further comprising a plurality of data lines extending in a column direction,
wherein the first through third pixel circuits are respectively connected to first through third data lines that are different from one another from among the plurality of data lines.

6. The display apparatus of claim 3, further comprising:
a fourth pixel circuit arranged on the substrate; and
a plurality of data lines extending in a column direction,
wherein the fourth pixel circuit is configured to commonly drive a seventh light-emitting element and an eighth light-emitting element located in a fourth column spaced apart from the third column with the second column therebetween from among the plurality of light-emitting elements,
wherein the third light-emitting element and the fourth light-emitting element emit light of a second color different from the first color,
wherein the second pixel circuit and the fourth pixel circuit are connected to one of the plurality of data lines.

7. The display apparatus of claim 1, wherein the second pixel circuit is further configured to commonly drive a seventh light-emitting element and an eighth light-emitting element located in a fourth column spaced apart from the third column with the second column therebetween from among the plurality of light-emitting elements.

8. The display apparatus of claim 1, further comprising:
a display area comprising a first display area and a second display area adjacent to a side of the first display area; and
a peripheral area outside the display area,
wherein the first pixel circuit is located only in the second display area.

9. The display apparatus of claim 1, wherein each of the first light-emitting element and the second light-emitting element comprises:
a pixel electrode arranged on the substrate;
an opposite electrode arranged on the pixel electrode; and
an intermediate layer located between the pixel electrode and the opposite electrode,
wherein the pixel electrode of the first light-emitting element and the pixel electrode of the second light-emitting element are integrally formed with each other.

10. A display apparatus, comprising:
a substrate:
a first pixel circuit arranged on the substrate;
a second pixel circuit arranged on the substrate;
a plurality of light-emitting elements arranged in a matrix on the substate; and
a conductive layer configured to electrically connect the first pixel circuit to the first and second light-emitting elements, wherein
the first pixel circuit is configured to commonly drive a first light-emitting element located in a first row and a second light-emitting element located in a second row different from the first row from among the light emitting elements.

11. A display apparatus comprising:
a substrate;
a plurality of pixel circuits located on the substrate, and each comprising a thin-film transistor and a storage capacitor;
a first organic insulating layer covering the plurality of pixel circuits;
a plurality of light-emitting elements located on the first organic insulating layer and arranged in rows and columns in a plan view;
a conductive layer located on the first organic insulating layer and electrically connected to the first pixel circuit; and
a second organic insulating layer located between the conductive layer and the pixel electrodes of the plurality of light-emitting elements,
wherein a first pixel circuit from among the plurality of pixel circuits is configured to commonly drive a first light-emitting element located in a first row and a second light-emitting element located in a second row different from the first row from among the plurality of light-emitting elements,
wherein each of the plurality of light-emitting elements comprises:
a pixel electrode arranged on the first organic insulating layer;
an opposite electrode on the pixel electrode; and
an intermediate layer located between the pixel electrode and the opposite electrode,
wherein the conductive layer is electrically connected to both a first a pixel electrode of the first light-emitting element and a second pixel electrode of the second light-emitting element.

12. The display apparatus of claim 11, further comprising an inorganic insulating layer located between the first organic insulating layer and the conductive layer.

13. The display apparatus of claim 11, wherein a first pixel electrode of the first light-emitting element and a second pixel electrode of the second light-emitting element are integrally formed with each other, and are electrically connected to the first pixel circuit.

14. The display apparatus of claim 11, wherein the first light-emitting element is located in a first column, and
the second light-emitting element is located in a second column different from the first column, and the first light-emitting element and the second light-emitting element emit light of a first color.

15. The display apparatus of claim 14, further comprising a second pixel circuit and a third pixel circuit arranged on the substrate,
wherein the second pixel circuit is configured to commonly apply driving current to a third light-emitting element and a fourth light-emitting element located in a third column between the first column and the second column from among the plurality of light-emitting elements, and
the third pixel circuit is configured to commonly apply driving current to a fifth light-emitting element located in the first row and the second column and a sixth light-emitting element located in the second row and the first column from among the plurality of light-emitting elements,
wherein the third light-emitting element and the fourth light-emitting element emit light of a second color different from the first color, and the fifth light-emitting element and the sixth light-emitting element emit light of a third color different from the first color and the second color.

16. The display apparatus of claim 15, further comprising a scan line located on the substrate and extending in a row direction, wherein the scan line is electrically connected to all of the first through third pixel circuits.

17. The display apparatus of claim 15, further comprising first through third data lines extending in a column direction and spaced apart from one another, wherein the first through third pixel circuits are respectively electrically connected to the first through third data lines.

18. The display apparatus of claim 11, further comprising:

a display area comprising a first display area and a second display area adjacent to a side of the first display area; and a peripheral area outside the display area, wherein the first pixel circuit is located only in the second display area.

19. The display apparatus of claim 11, wherein the first light-emitting element and the second light-emitting element emit light of a same color, and the display apparatus further comprising:

a second pixel circuit configured to commonly drive a third light-emitting element and a fourth light-emitting element located in a third column between the first column and the second column from among the plurality of light-emitting elements.

20. The display apparatus of claim 11, further comprising a scan line extending in a row direction and commonly connected to the first and second pixel circuits.

* * * * *